US011309416B2

(12) United States Patent
Hatta et al.

(10) Patent No.: US 11,309,416 B2
(45) Date of Patent: Apr. 19, 2022

(54) SEMICONDUCTOR DEVICE

(71) Applicant: Mitsubishi Electric Corporation, Tokyo (JP)

(72) Inventors: Hideyuki Hatta, Tokyo (JP); Shiro Hino, Tokyo (JP); Katsutoshi Sugawara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/757,766

(22) PCT Filed: Dec. 21, 2017

(86) PCT No.: PCT/JP2017/045910
§ 371 (c)(1),
(2) Date: Apr. 21, 2020

(87) PCT Pub. No.: WO2019/123601
PCT Pub. Date: Jun. 27, 2019

(65) Prior Publication Data
US 2020/0295183 A1 Sep. 17, 2020

(51) Int. Cl.
*H01L 29/78* (2006.01)
*H01L 29/08* (2006.01)
(Continued)

(52) U.S. Cl.
CPC ...... *H01L 29/7813* (2013.01); *H01L 29/0843* (2013.01); *H01L 29/1095* (2013.01);
(Continued)

(58) Field of Classification Search
CPC ............. H01L 29/7813; H01L 29/0843; H01L 29/1608; H01L 29/4236; H01L 29/66068;
(Continued)

(56) References Cited

U.S. PATENT DOCUMENTS 5,894,139 A    4/1999  Otsuki et al.
2009/0014719 A1*  1/2009  Shimizu ............ H01L 29/66068
                                                            257/49
(Continued)

FOREIGN PATENT DOCUMENTS

JP    06-13620 A    1/1994
JP    09-321290 A   12/1997
(Continued)

OTHER PUBLICATIONS

International Search Report and Written Opinion dated Mar. 6, 2018 for PCT/JP2017/045910 filed on Dec. 21, 2017, 10 pages including English Translation of the International Search Report.

*Primary Examiner* — Shahed Ahmed
(74) *Attorney, Agent, or Firm* — Xsensus LLP

(57) ABSTRACT

A drift layer has a first conductivity type. A well region has a second conductivity type. A well contact region has a resistivity lower than that of the well region. A source contact region is provided on the well region, separated from the drift layer by the well region, and has the first conductivity type. A source resistance region is provided on the well region, separated from the drift layer by the well region, is adjacent to the source contact region, has the first conductivity type, and has a sheet resistance higher than that of the source contact region. A source electrode contacts the source contact region, the well contact region, and the source resistance region, and is continuous with the channel at least through the source resistance region.

15 Claims, 32 Drawing Sheets

(51) Int. Cl.
*H01L 29/10* (2006.01)
*H01L 29/16* (2006.01)
*H01L 29/423* (2006.01)
*H01L 29/66* (2006.01)
*H01L 29/739* (2006.01)

(52) U.S. Cl.
CPC ...... *H01L 29/1608* (2013.01); *H01L 29/4236* (2013.01); *H01L 29/66068* (2013.01); *H01L 29/66734* (2013.01); *H01L 29/739* (2013.01)

(58) Field of Classification Search
CPC ............. H01L 29/66734; H01L 29/739; H01L 29/0869; H01L 29/7828; H01L 29/66333; H01L 29/7395; H01L 29/0623; H01L 29/7803; H01L 29/66325–66348; H01L 29/7393–7398; H01L 29/083–0834
See application file for complete search history.

(56) References Cited

U.S. PATENT DOCUMENTS

| | | | | |
|---|---|---|---|---|
| 2017/0229535 | A1* | 8/2017 | Hatta | H01L 29/0865 |
| 2018/0096991 | A1* | 4/2018 | Nasu | H01L 29/4238 |
| 2018/0308935 | A1* | 10/2018 | Shimizu | H01L 29/167 |
| 2020/0098910 | A1* | 3/2020 | Nakagawa | H01L 29/7813 |

FOREIGN PATENT DOCUMENTS

| | | |
|---|---|---|
| JP | 10-150193 A | 6/1998 |
| JP | 2013-239554 A | 11/2013 |
| JP | 2015-228496 A | 12/2015 |
| WO | 2017/126472 A1 | 7/2017 |

* cited by examiner

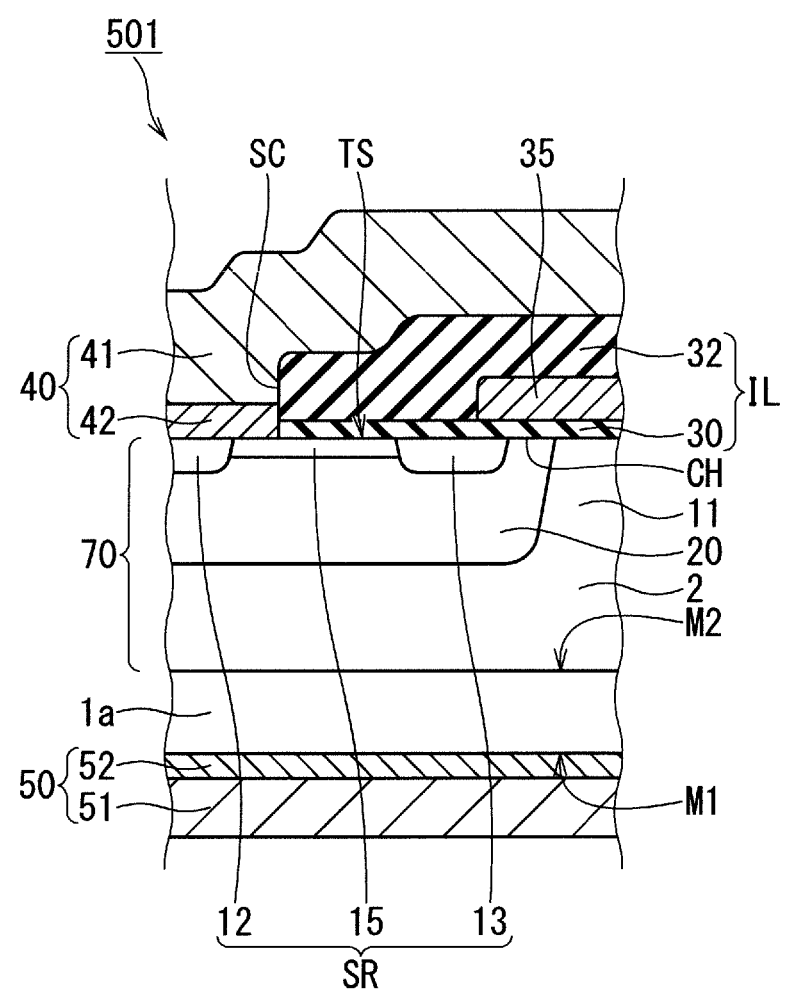
F I G. 2

F I G. 3
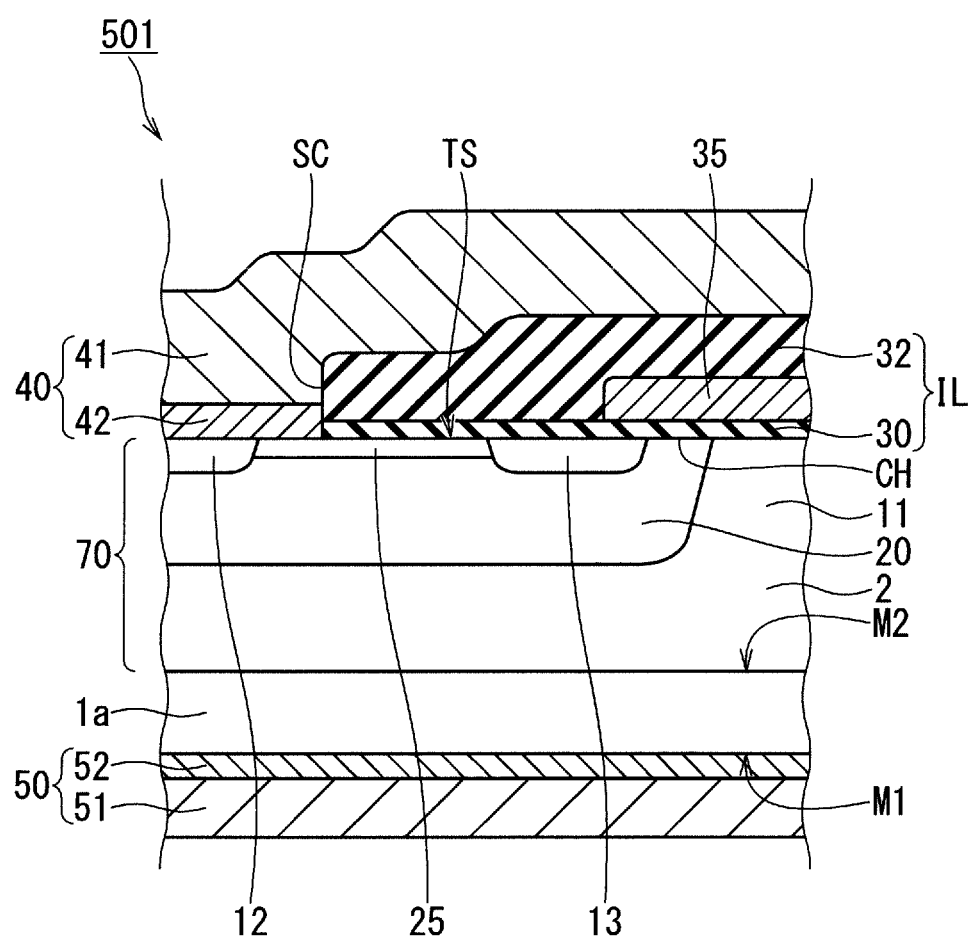

F I G. 5
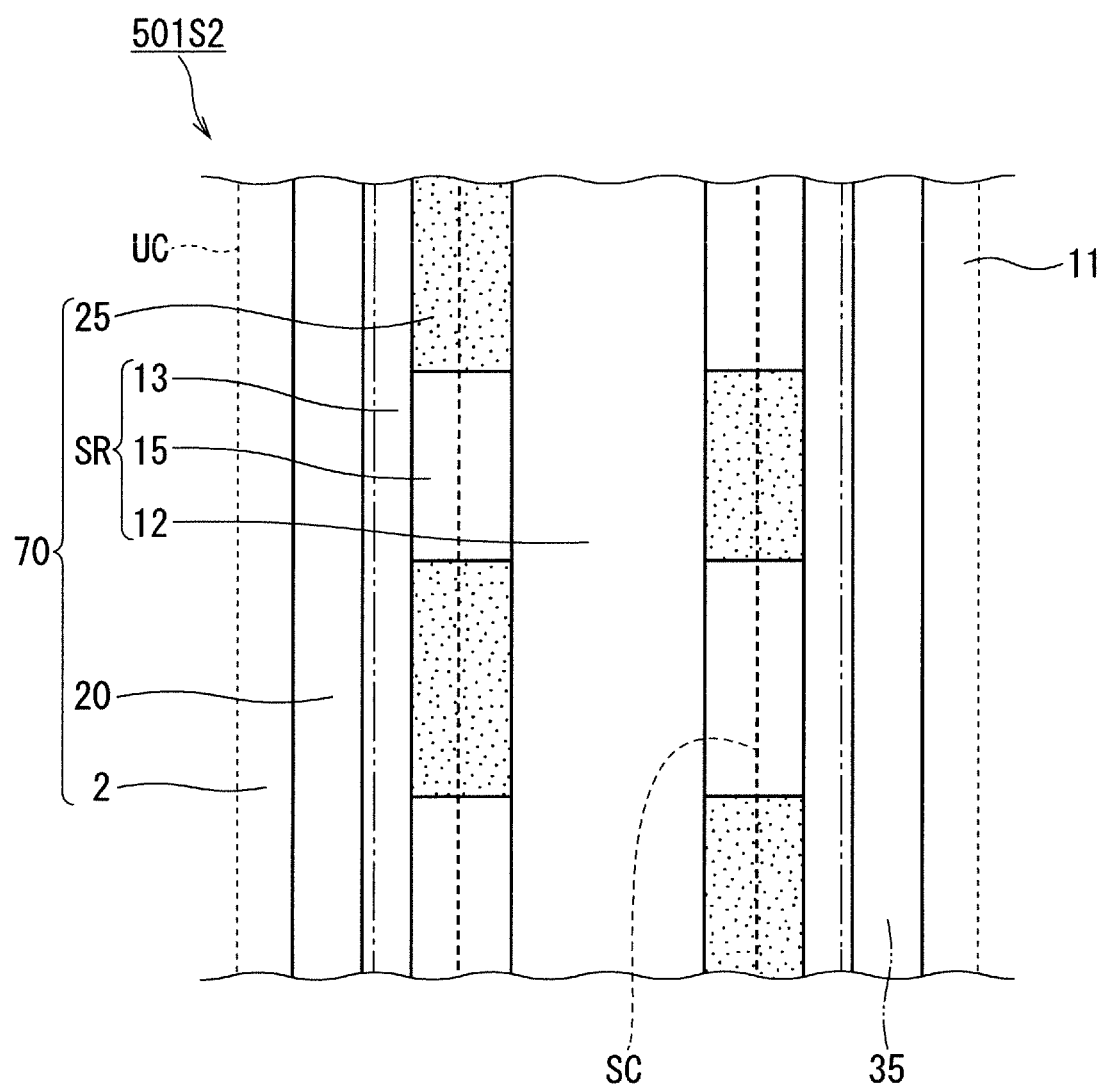

F I G. 6
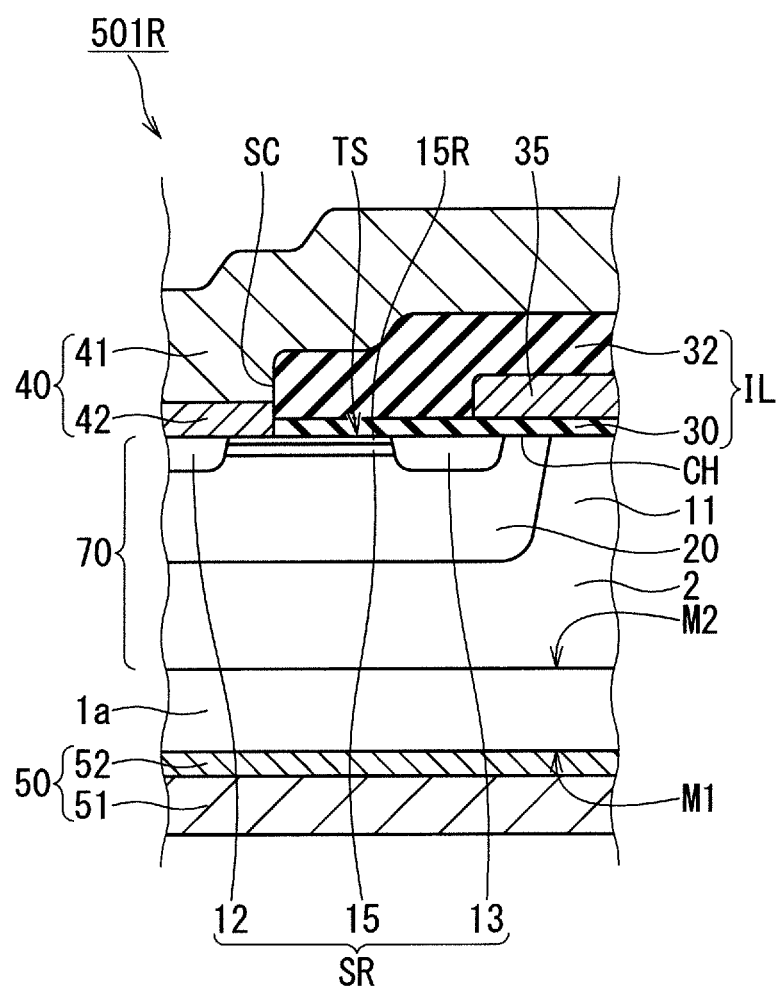

F I G. 1 9
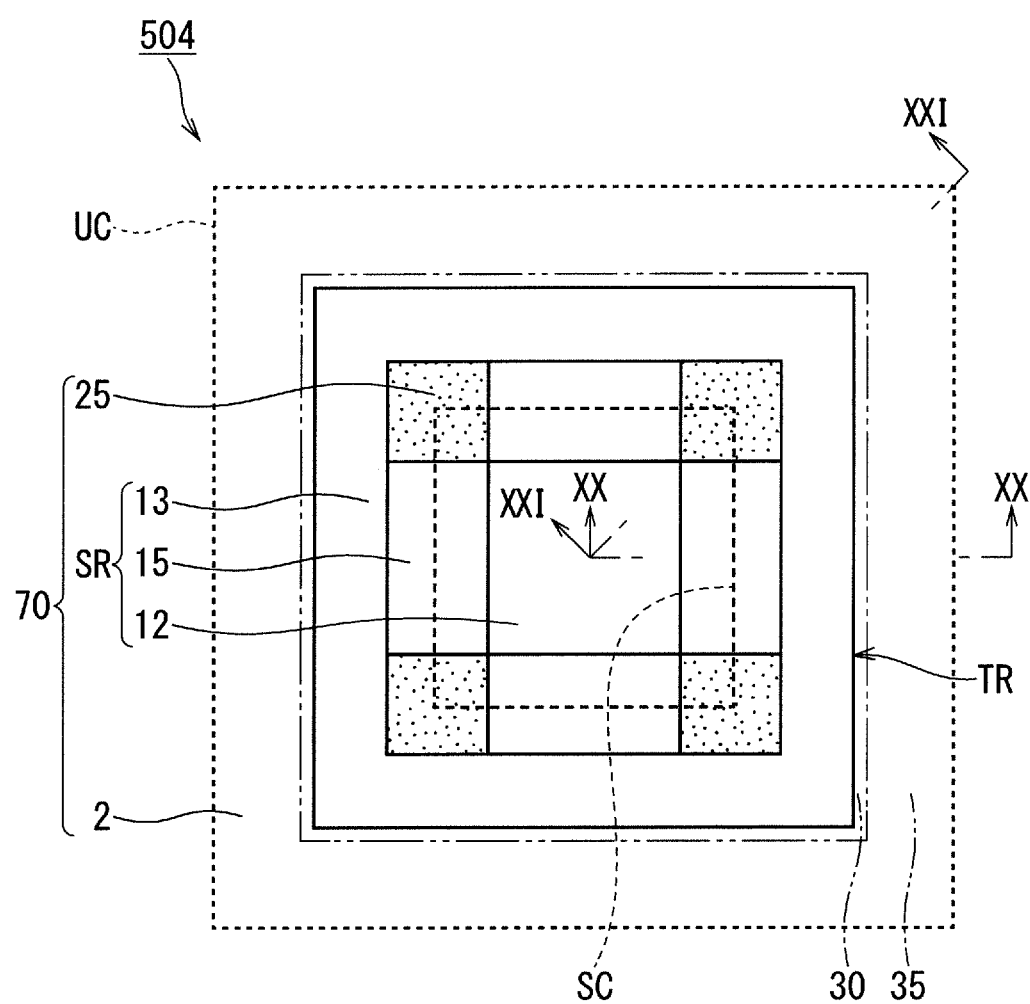

F I G. 2 4
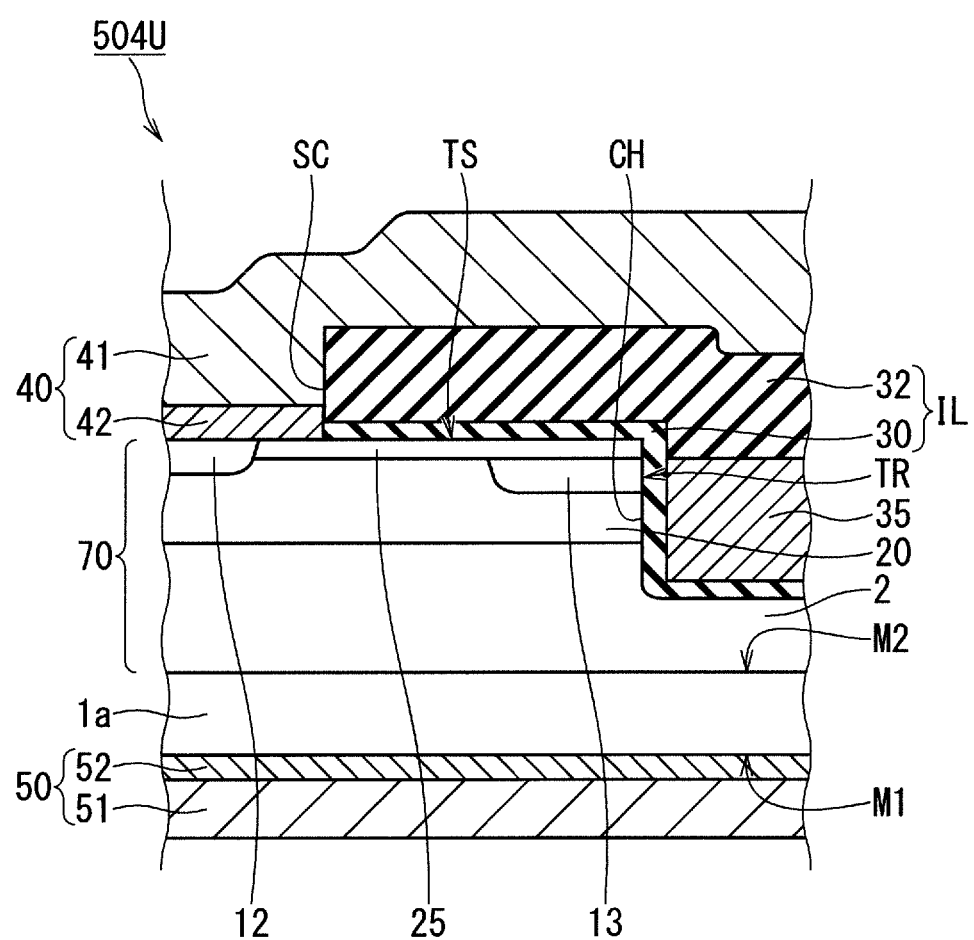

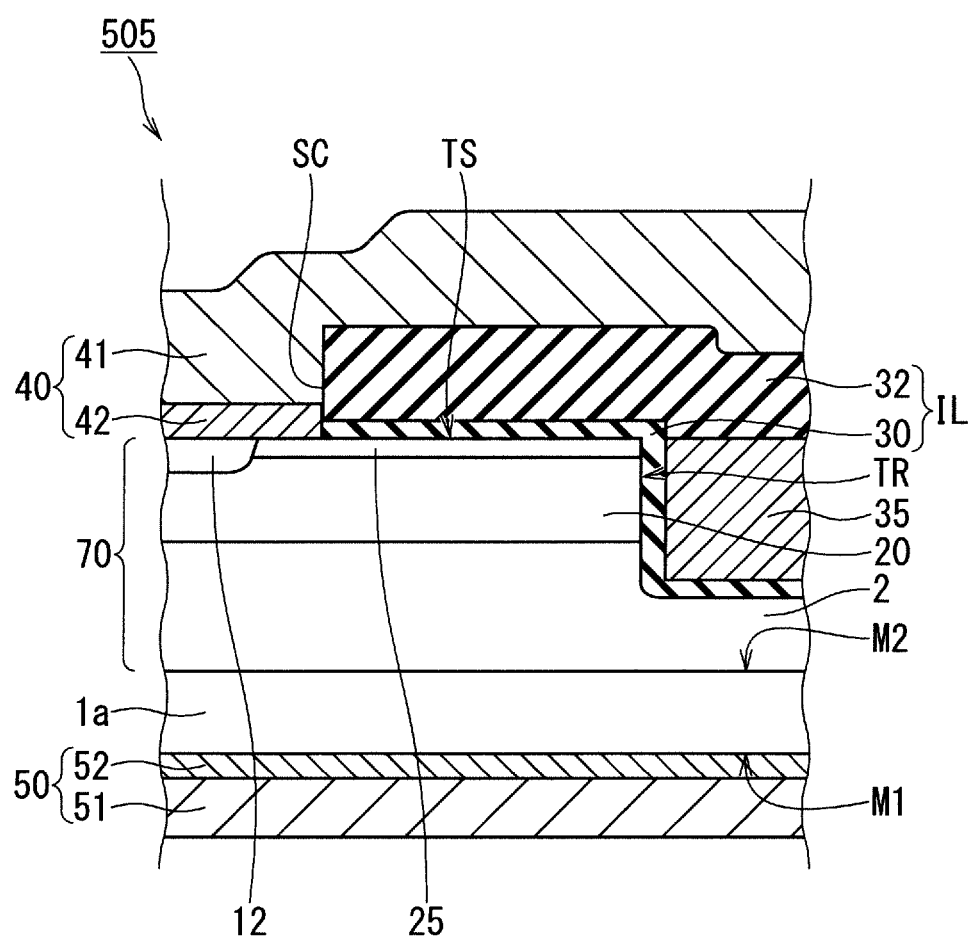
F I G. 2 7

F I G. 2 9
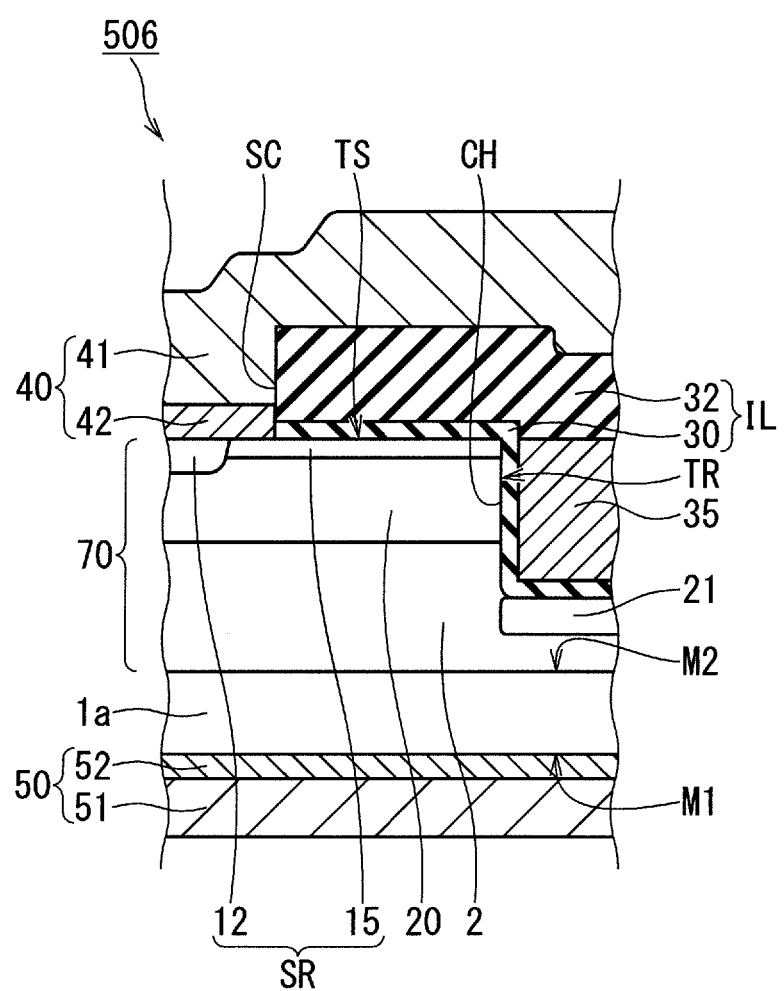

F I G. 3 0
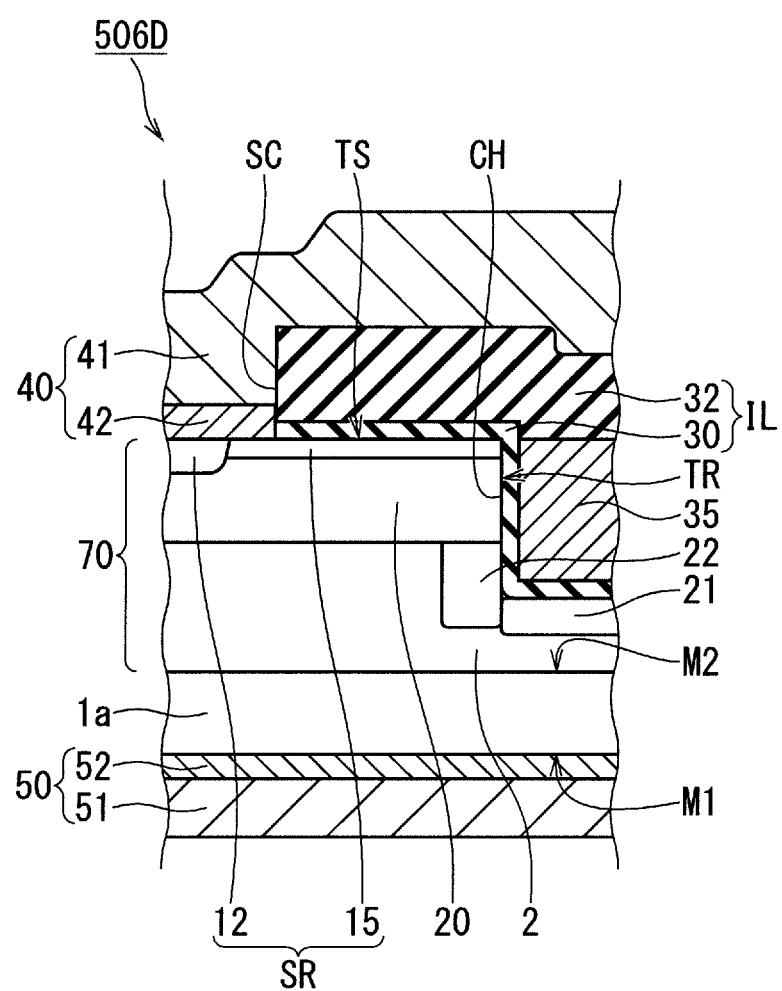

SEMICONDUCTOR DEVICE

CROSS-REFERENCE TO RELATED APPLICATIONS

The present application is based on PCT filing PCT/JP2017/045910, filed Dec. 21, 2017, the entire contents of which are incorporated herein by reference.

TECHNICAL FIELD

The present invention relates to a semiconductor device, particularly, to a semiconductor device with a gate electrode and a gate insulating film.

BACKGROUND ART

Semiconductor devices used in the field of power electronics include a metal-insulator-semiconductor field-effect transistor (MISFET)), an insulated gate bipolar transistor (IGBT), etc. A metal-oxide-semiconductor field effect transistor (MOSFET) is particularly used widely as the MISFET. In terms of application to power electronics, such semiconductor devices are desired to have high reliability. One of significant indexes to reliability is short-circuit tolerance. This will be described below.

If a load short-circuit such as an arm short-circuit occurs while an inverter circuit using an MOSFET operates an inductive load or a resistive load, for example, a high voltage substantially equal to a power supply voltage is applied to a drain electrode of the MOSFET in an on-state. Then, a large drain current, which is several times to tens of times of a rated current, is induced in the MOSFET. Continuous flow of such a large current results in the breakdown of the MOSFET. In response to this, in some cases, a circuit for protecting the MOSFET from such breakdown is provided. Typically, if an excessive drain current (overcurrent) is detected, an off signal is sent to the gate electrode to interrupt the drain current. It takes some time from the occurrence of the overcurrent to the interruption of the drain current. Hence, the MOSFET is required to have robustness, namely, short-circuit tolerance with which the MOSFET can withstand the large current throughout this time. Short-circuit tolerance is defined roughly using time required from the occurrence of a short-circuit to element breakdown. Being excellent in short-circuit tolerance means that it takes long time to the occurrence of breakdown. Consideration for achieving excellent short-circuit tolerance have been given as follows, for example.

According to Japanese Patent Application Laid-Open No. 2013-239554 (patent document 1), a source region of an MOSFET includes a source contact region connected to a source pad, a source extension region adjacent to a channel region in a well region, and a source resistance region between the source extension region and the source contact region. The source resistance region does not have implanted ions. The source contact region is connected to a source pad through an ohmic electrode. The ohmic electrode does not contact the source extension region and the source contact region.

According to Japanese Patent Application Laid-Open No. 2015-228496 (patent document 2), an MOSFET includes a second conductivity type well region formed in a surface-side part of a drift layer, and a first conductivity type source region formed in the well region. The source region has a source-narrowed part of a narrow width.

PRIOR ART DOCUMENTS

Patent Documents

Patent document 1: Japanese Patent Application Laid-Open No. 2013-239554
Patent document 2: Japanese Patent Application Laid-Open No. 2015-228496

SUMMARY

Problem to be Solved by the Invention

According to the foregoing technique of Japanese Patent Application Laid-Open No. 2013-239554, the source region defined by the source contact region, the source extension region, and the source resistance region may have a great length. This increases a cell pitch of a unit cell of the MOSFET to result in reduction in an on-current allowed to flow in the same area. Hence, in some cases, an on-resistance is increased largely. Additionally, as a result of the absence of ions implanted in the source resistance region, the source resistance region is given an excessively high sheet resistance in some cases. As a result, the on-resistance fluctuates largely in response to fluctuation of the length of the source resistance region. Thus, in some cases, the foregoing technique cannot be considered to be effective solution in consideration of productivity.

According to the foregoing technique of Japanese Patent Application Laid-Open No. 2015-228496, an impurity concentration in the source-narrowed part is comparable to that in the other part of the source region. Hence, to ensure sufficient resistance in the source-narrowed part, the source-narrowed part is required to be extended in length. This increases a cell pitch of a unit cell of the MOSFET to result in reduction in an on-current allowed to flow in the same area. Hence, in some cases, an on-resistance is increased largely.

The present invention has been made to solve the foregoing problems, and is intended to provide a semiconductor device capable of improving short-circuit tolerance by generating large voltage drop from a channel region to a source electrode while maintaining an on-resistance at a low level.

Means to Solve the Problem

A semiconductor device according to the present invention has a channel. The semiconductor device includes a semiconductor substrate, a drain electrode, a drift layer, a well region, a well contact region, a source contact region, a source resistance region, a gate insulating film, a gate electrode, and a source electrode. The semiconductor substrate has a first main surface and a second main surface on the opposite side of the first main surface, and has an in-plane direction parallel to the second main surface. The drain electrode is provided on the first main surface of the semiconductor substrate. The drift layer is provided on the second main surface of the semiconductor substrate and has a first conductivity type. The well region is provided on the drift layer, has a second conductivity type different from the first conductivity type, and has a part forming the channel of the semiconductor device. The well contact region is provided on the well region, has the second conductivity type, and has a resistivity lower than that of the well region. The source contact region is provided on the well region, separated from the drift layer by the well region, and has the first conductivity type. The source resistance region is provided on the well region, separated from the drift layer by the well region, adjacent to the source contact region in the in-plane direction, has the first conductivity type, and has a sheet resistance higher than that of the source contact region. The gate insulating film covers the channel of the well region. The gate electrode is provided on the gate insulating film. The source electrode contacts the source contact region, the well contact region, and the source resistance region, and is continuous with the channel at least through the source resistance region.

Effects of the Invention

The present invention achieves improvement of a trade-off between short-circuit tolerance and an on-resistance.

These and other objects, features, aspects and advantages of the present invention will become more apparent from the following detailed description of the present invention when taken in conjunction with the accompanying drawings.

BRIEF DESCRIPTION OF DRAWINGS

FIG. 2 is a cross-sectional view schematically showing the configuration of the semiconductor device according to the first embodiment of the present invention at a cross section taken along a line II-II in FIG. 1;

FIG. 3 is a cross-sectional view schematically showing the configuration of the semiconductor device according to the first embodiment of the present invention at a cross section taken along a line in FIG. 1;

FIG. 5 is a top view showing a modification of FIG. 4;

FIG. 6 is a cross-sectional view showing a modification of FIG. 2;

FIG. 19 is a top view schematically showing the configuration of a semiconductor layer in a unit cell of a semiconductor device according to a fourth embodiment of the present invention;

FIG. 24 is a cross-sectional view schematically showing the configuration of the semiconductor device according to the modification of the fourth embodiment of the present invention at a cross section taken along a line XXIV-XXIV in FIG. 22;

FIG. 27 is a cross-sectional view schematically showing the configuration of the semiconductor device according to the fifth embodiment of the present invention at a cross section taken along a line XXVII-XXVII in FIG. 25;

FIG. 29 is a cross-sectional view schematically showing the configuration of a semiconductor device according to a sixth embodiment of the present invention taken from a viewing field similar to that of FIG. 26;

FIG. 30 is a cross-sectional view showing a modification of FIG. 29;

DESCRIPTION OF EMBODIMENTS

In the following description of embodiments of the present invention, a "first conductivity type" is an n-type and a "second conductivity type" is a p-type. Alternatively, the "first conductivity type" may be a p-type and the "second conductivity type" may be an n-type. Further, a semiconductor element such as a MOSFET or an IGBT will be described in detail as a "semiconductor device" in a narrow sense. However, the "semiconductor device" in a broad sense may have other structures in addition to such semiconductor elements. As an example, the "semiconductor device" in this broad sense may be a semiconductor module (more specifically, a power module such as an inverter module) including a chip functioning as the foregoing semiconductor element, a free-wheel diode connected inverse-parallel to the semiconductor element, and a control circuit for applying a voltage to a gate electrode of the semiconductor element.

These members in the semiconductor module may be integrated by being mounted on a lead frame and then sealed.

The embodiments of the present invention will be described below on the basis of the drawings. Corresponding or comparable parts of the drawings referred to below will be given the same reference number and may not be described repeatedly.

First Embodiment (Configuration)

Figure 1:
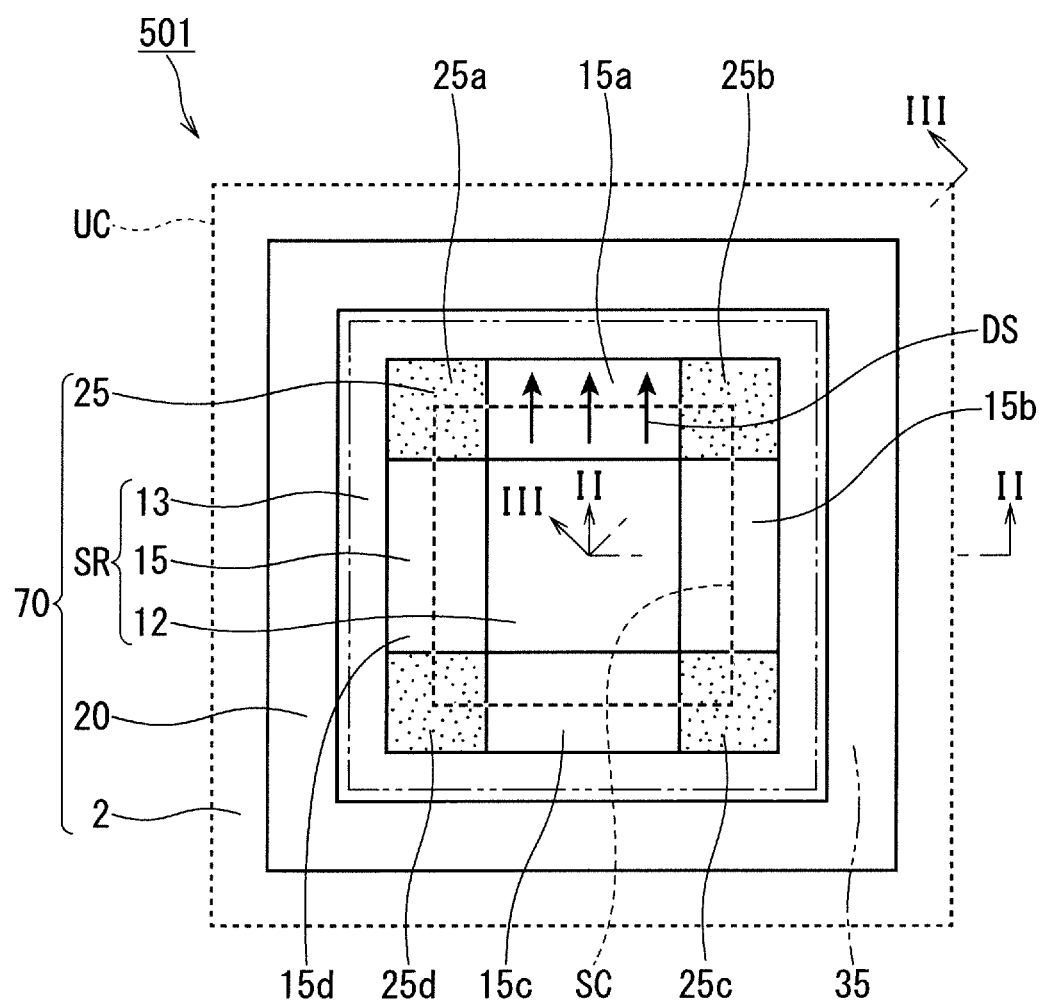
FIG. 1 is a top view schematically showing the configuration of a semiconductor layer in a unit cell of a semiconductor device according to a first embodiment of the present invention.

FIG. 1 is a top view schematically showing the configuration of a semiconductor layer (epitaxial layer 70 in FIGS. 2 and 3) in a unit cell UC of an MOSFET 501 (semiconductor device) according to a first embodiment. In FIG. 1 and the other top views referred to below, to increase the viewability of the drawings, a well contact region 25 is given a dot pattern. FIGS. 2 and 3 are cross-sectional views schematically showing the configuration of the MOSFET 501 at cross sections taken along a line II-II and a line in FIG. 1 respectively. An active region of the MOSFET 501 includes a plurality of unit cells UC arranged in a matrix, and one of these unit cells UC is shown in FIG. 1. While the unit cell UC shown in FIG. 1 has a rectangular shape, a unit cell may have a different shape such as a hexagonal shape, an octagonal shape, or a circular shape, for example. A terminal region (not shown in the drawings) is provided outside the active region.

The MOSFET 501 includes a semiconductor substrate 1a, a drain electrode 50, an epitaxial layer 70 (semiconductor layer), an insulating layer IL, a gate electrode 35, and a source electrode 40. The epitaxial layer 70 includes a drift layer 2, a well region 20, the well contact region 25, and a source region SR. The well contact region 25 may include a plurality of parts separated from each other (hereinafter called "well contact parts"). In FIG. 1, the well contact region 25 includes well contact parts 25a to 25d. The source region SR includes a source contact region 12 and a source resistance region 15. The source region SR of the first embodiment additionally includes a source extension region 13. The source resistance region 15 may include a plurality of parts separated from each other (hereinafter called "source resistance parts"). In FIG. 1, the source resistance region 15 includes source resistance parts 15a to 15d. The insulating layer IL includes a gate insulating film 30, and typically, includes an interlayer insulating film 32 further. A field oxide film (not shown in the drawings) may be provided outside the active region.

The semiconductor substrate 1a has a lower surface M1 (first main surface) and an upper surface M2 (second main surface) on the opposite side of the lower surface M1. In the present description, a direction parallel to the upper surface M2 is called an "in-plane direction." Thus, the "in-plane direction" in FIG. 1 is any direction parallel to a viewing field of FIG. 1. In FIGS. 2 and 3, the "in-plane direction" is any direction vertical to the longitudinal direction of FIGS. 2 and 3. The semiconductor substrate 1a has the n-type (first conductivity type). The epitaxial layer 70 is provided on the upper surface M2 of the semiconductor substrate 1a. The epitaxial layer 70 can be formed by epitaxial growth on the upper surface M2 of the semiconductor substrate 1a. The epitaxial layer has a surface TS on the opposite side of a surface facing the upper surface M2. The surface TS is substantially parallel to the foregoing in-plane direction. The semiconductor substrate 1a and the epitaxial layer 70 form an epitaxial substrate having the surface TS.

Preferably, a wide bandgap semiconductor is used as a semiconductor material for forming the semiconductor substrate 1a and the epitaxial layer 70. In the first embodiment and the other embodiments described later, silicon carbide is used. Thus, the drift layer 2 and the well region 20 in the epitaxial layer 70 are made of silicon carbide. A wide bandgap semiconductor material other than silicon carbide is applicable. For example, gallium nitride, aluminum nitride, or diamond may be used. A semiconductor material other than a wide bandgap semiconductor material is applicable. For example, silicon may be used.

The drain electrode 50 includes a drain contact electrode 52 and an electrode layer 51. The drain contact electrode 52 is provided on the lower surface M1 of the semiconductor substrate 1a and ohmically connected to the semiconductor substrate 1a. The electrode layer 51 is provided on the drain contact electrode 52.

The source electrode 40 includes a source contact electrode 42 and an electrode layer 41. The source contact electrode 42 is provided over the upper surface M2 of the semiconductor substrate 1a in the presence of the epitaxial layer 70 therebetween. Therefore, the MOSFET 501 is a vertical semiconductor device having a current path extending in the longitudinal direction (thickness direction). The electrode layer 41 contacts the source contact electrode 42 and may be separated from the semiconductor substrate 1a.

The drift layer 2 is provided on the upper surface M2 of the semiconductor substrate 1a and has the n-type, which is also the conductivity type of the semiconductor substrate 1a. Typically, the drift layer 2 is a part of the epitaxial layer 70 formed in an epitaxial growth step performed on the semiconductor substrate 1a and in which substantially no impurities are implanted in a subsequent step.

The well region 20 is provided on a part of the drift layer 2. In other words, the well region 20 is provided in a part of a surface-side part of the epitaxial layer 70. The well region 20 has the p-type (second conductivity type different from the first conductivity type).

The source region SR is provided on the well region 20, separated from the drift layer 2 by the well region 20. In other words, the source region SR is provided in a part of surface-side part of the well region 20. The source region SR has the n-type. As described above, the source region SR includes the source contact region 12 and the source resistance region 15. The source region SR of the first embodiment additionally includes the source extension region 13. In the first embodiment, the source resistance region 15 is arranged on the surface TS of the epitaxial layer 70.

The well region 20 has a part to function as a channel CH. In the first embodiment, a part of the surface-side part of the well region 20 located between the source region SR and the drift layer 2 functions as the channel CH of the MOSFET 501. The channel CH is a path from the source region SR to the drift layer 2 (in the first embodiment, an electron path), and is induced when the MOSFET 501 is in an on-state. More specifically, a part of the surface-side part of the well region 20 located between the source extension region 13 and the drift layer 2 functions as the channel CH. As shown in FIGS. 2 and 3, the channel CH extends in the in-plane direction. For this reason, the MOSFET 501 is of a planar type.

A part of a surface-side part of the drift layer 2 and adjacent to the well region 20 is called a junction field effect transistor (JFET) region, which is indicated as a JFET region 11 in FIGS. 2 and 3. The JFET region 11 forms a part of a current path between the channel CH and the semiconductor substrate 1a and is reduced in width by the well region 20. A drain current (on-current) to flow from the drain electrode 50 into the drift layer 2 through the semiconductor substrate 1a in an on-state passes through the JFET region 11, the channel CH, the source extension region 13, the source resistance region 15, the source contact region 12, and the source contact electrode 42 to reach the electrode layer 41 of the source electrode 40.

The well contact region 25 is provided on the well region 20. The well contact region 25 is arranged outside the source contact region 12 on the surface TS of the epitaxial layer 70. The well contact region 25 has the p-type and has a resistivity lower than that of the well region 20.

Each of the source resistance region 15 and the well contact region 25 is arranged between the source contact region 12 and the source extension region 13 in the in-plane direction. In FIG. 1, the source resistance region 15 is arranged between the source contact region 12 and the source extension region 13 in the transverse direction and the longitudinal direction of FIG. 1, which are parts of the in-plane direction. Further, the well contact region is arranged between the source contact region 12 and the source extension region 13 in an oblique direction of FIG. 1, which is a part of the in-plane direction. The source resistance region 15 is adjacent to the source contact region 12 in the in-plane direction. The source resistance region 15 is adjacent to the well contact region 25 in the in-plane direction. The source resistance region 15 has a higher sheet resistance than that of the source contact region 12 An impurity concentration in the source resistance region 15 is lower than those in the source contact region 12 and the source extension region 13. The source resistance region 15 may have implanted ions for adjusting the sheet resistance thereof as described later.

The source extension region 13 is adjacent to the source resistance region 15 and separated from the source contact region 12. The source extension region 13 is continuous with the channel CH. In this way, in the first embodiment, the source resistance region 15 is continuous with the channel CH through the source extension region 13. As shown in FIG. 1, the source extension region 13 is the outermost peripheral part of the source region SR in each unit cell UC and surrounds the source resistance region 15 and the well contact region 25 from outside.

The arrangement in the illustration of FIG. 1 is such that each of the source contact region 12, the source extension region 13, and the source resistance region 15 is adjacent to the well contact region 25. However, this is not the only arrangement of the well contact region 25.

Preferably, a concentration distribution of n-type impurities, namely, a donor concentration distribution in the source resistance region 15 is uniform in a direction from the source extension region 13 toward the source contact region 12. In this case, a source resistance realized by the source resistance region 15 is controlled to a design value with increased accuracy. In this way, robustness of manufacture is improved. More preferably, this impurity concentration distribution is uniform in a plan view (in the top view of FIG. 1). Still more preferably, this impurity concentration distribution is substantially equal throughout the MOSFET 501 entirely including a plurality of the unit cells UC. This allows suppression of imbalance of an overcurrent to flow on the occurrence of a short-circuit trouble, thereby reducing the short-circuit tolerance of the MOSFET and improving reliability.

An impurity concentration in the source contact region 12 and an impurity concentration in the source extension region 13 may be substantially equal. The source contact region 12 and the source extension region 13 can be formed simultaneously as described later, and this provides the same impurity concentration distribution in the source contact region 12 and the source extension region 13.

The gate insulating film 30 is provided on the surface TS of the epitaxial layer 70 and cover the channel CH in the well region 20. The gate electrode 35 is provided on the gate insulating film 30 and faces the channel CH across the gate insulating film 30. In the first embodiment, the gate electrode 35 extends over the source extension region 13, the channel CH, and the JFET region 11 across the gate insulating film 30, and does not extend over the source contact region 12 and the source resistance region 15. In this way, of the source contact region 12, the source extension region 13, and the source resistance region 15 forming the source region SR, only the source extension region 13 forms an MOS structure together with the gate insulating film 30 and the gate electrode 35. The well contact region 25 is arranged in such a manner as not to have a part contacting the gate electrode 35 with only the gate insulating film 30 interposed therebetween.

The interlayer insulating film 32 covers the gate electrode 35. The insulating layer IL including the gate insulating film 30 and the interlayer insulating film 32 is provided with a contact hole SC (source contact hole) in which the source electrode 40 is buried. In the contact hole SC, the source contact electrode 42 of the source electrode 40 contacts the source contact region 12, the well contact region 25, and the source resistance region 15. The source contact electrode 42 is separated from the source extension region 13.

The source contact electrode 42 contacts the source contact region 12 having a sufficiently high impurity concentration to be ohmically connected to the source contact region 12 at a low contact resistance. By doing so, the source electrode 40 becomes continuous with the channel CH through the source resistance region 15 adjacent to the source contact region 12, in the first embodiment, becomes continuous with the channel CH through the source resistance region 15 and the source extension region 13.

The source contact electrode 42 further contacts the well contact region 25 having a sufficiently high impurity concentration to be ohmically connected to the well contact region 25 at a low contact resistance. In this way, the source electrode 40 is not only electrically connected to the source contact region 12 but is also electrically connected to the well region 20. The electrode layer 41 contacts the source contact electrode 42 in the contact hole SC and extends over the interlayer insulating film 32.

To provide a significant resistance value to the source resistance region 15, an impurity concentration in the source resistance region 15 is required to be sufficiently low. If the impurity concentration in the source resistance region 15 is reduced to be less than a certain level, a contact resistance between the source resistance region 15 and the source contact electrode 42 is increased considerably. In this case, electrical connection between the source resistance region 15 and the source contact electrode 42 is formed substantially only through the source contact region 12. Thus, even while the source resistance region 15 partially contacts the source contact electrode 42, the source resistance region 15 as a whole between the source contact region 12 and the source extension region 13 becomes functional to contribute to a source resistance. As a result, while a large area is ensured for contact of each of the source contact region 12 and the well contact region 25 with the source contact electrode 42 for reducing a contact resistance and while a sufficiently large source resistance is ensured, it becomes possible to suppress the area of the source region SR. This achieves reduction in the pitch of the unit cell UC. As a sufficient source resistance is ensured as described above, short-circuit tolerance is improved. Further, as the pitch of the unit cell UC is reduced as described above, an on-resistance per unit area is suppressed. In this way, it becomes possible to improve a trade-off between short-circuit tolerance and an on-resistance.

If a current corresponding to a current at an interface between the source contact region 12 and the source contact electrode 42 unintentionally flows at an interface between the source resistance region 15 and the source contact electrode 42, drop of an effective resistance value becomes unavoidable in the source resistance region 15. This necessitates increase in the length of the source resistance region 15 for obtaining an intended resistance value, causing increase in the pitch of the unit cell UC in some cases. Preferably, a contact resistance ($\Omega \cdot cm^2$) between the source contact electrode 42 and the source resistance region 15 is ten times larger or more than a contact resistance ($\Omega \cdot cm^2$) between the source contact electrode 42 and the source contact region 12.

Even if the contact resistance between the source contact electrode 42 and the source resistance region 15 is not so large to make direct electrical connection therebetween non-negligible, the presence of a region in which the source contact electrode 42 and the source resistance region 15 do not overlap each other in a plan view still makes it possible to ensure a sufficient source resistance. On the assumption that the source resistance region 15 entirely overlaps the source contact electrode 42, the source contact electrode 42 is unavoidably brought into contact with the source extension region 13. This disables the source resistance region 15 to function as a source resistance between the source contact electrode 42 and the channel CH.

As shown in FIG. 1, the contact hole SC has an outer periphery crossing the source resistance region 15. More specifically, the outer periphery of the contact hole SC includes a part crossing the source resistance part 15a, a part crossing the source resistance part 15b, a part crossing the source resistance part 15c, and a part crossing the source resistance part 15d. Preferably, the part of the outer periphery of the contact hole SC crossing the source resistance region 15 extends linearly. In FIG. 1, this part corresponds to a side of a polygon forming the outer periphery of the contact hole SC. More preferably, the contact hole SC has an outer periphery crossing each of the source resistance parts 15a to 15d of the source resistance region 15 between parts of the well contact region 25 (two of the well contact parts 25a to 25d). In FIG. 1, the outer periphery of the contact hole SC has a polygonal shape with linear sides crossing the source resistance parts, and corners located at the well contact parts.

As a result of the provision of the outer periphery of the contact hole SC in the foregoing manner, a more uniform current distribution is provided in the source resistance region 15. In FIG. 1, a uniform flow of a current DS in the source resistance part 15a of the source resistance region 15 is shown as an example. Providing the uniform current distribution reduces a ratio of an area of the source resistance region 15 not functioning sufficiently as a source resistance. This makes it possible to suppress the area of the source resistance region 15 while short-circuit tolerance is ensured. As a result, the pitch of the unit cell UC can be reduced. This achieves improvement a trade-off between short-circuit tolerance and an on-resistance to a greater extent.

In the configuration shown in FIG. 1, each of the source resistance parts 15a to 15d in one unit cell UC has a shape as a rectangle. This rectangle has a first long side, a second long side, a first short side, and a second short side. The first long side is continuous with the source contact region 12. The second long side is continuous with the source extension region 13. In this way, a current path extending in the short-side direction of the rectangle is formed. This achieves uniform flow of the current DS. To prevent additional formation of a path in which a nonuniform current is to flow, the first and second short sides are preferably continuous with a region having a conductivity type different from that of the source resistance parts 15a to 15d, namely, a region having the p-type. In the first embodiment, the first and second short sides are continuous with the well contact region 25. In this way, the well contact region 25 of the first embodiment not only has the function for obtaining favorable electrical connection between the source electrode 40 and the well region 20 but also has the function of providing a uniform flow of the current DS.

(Modifications)

Figure 4:
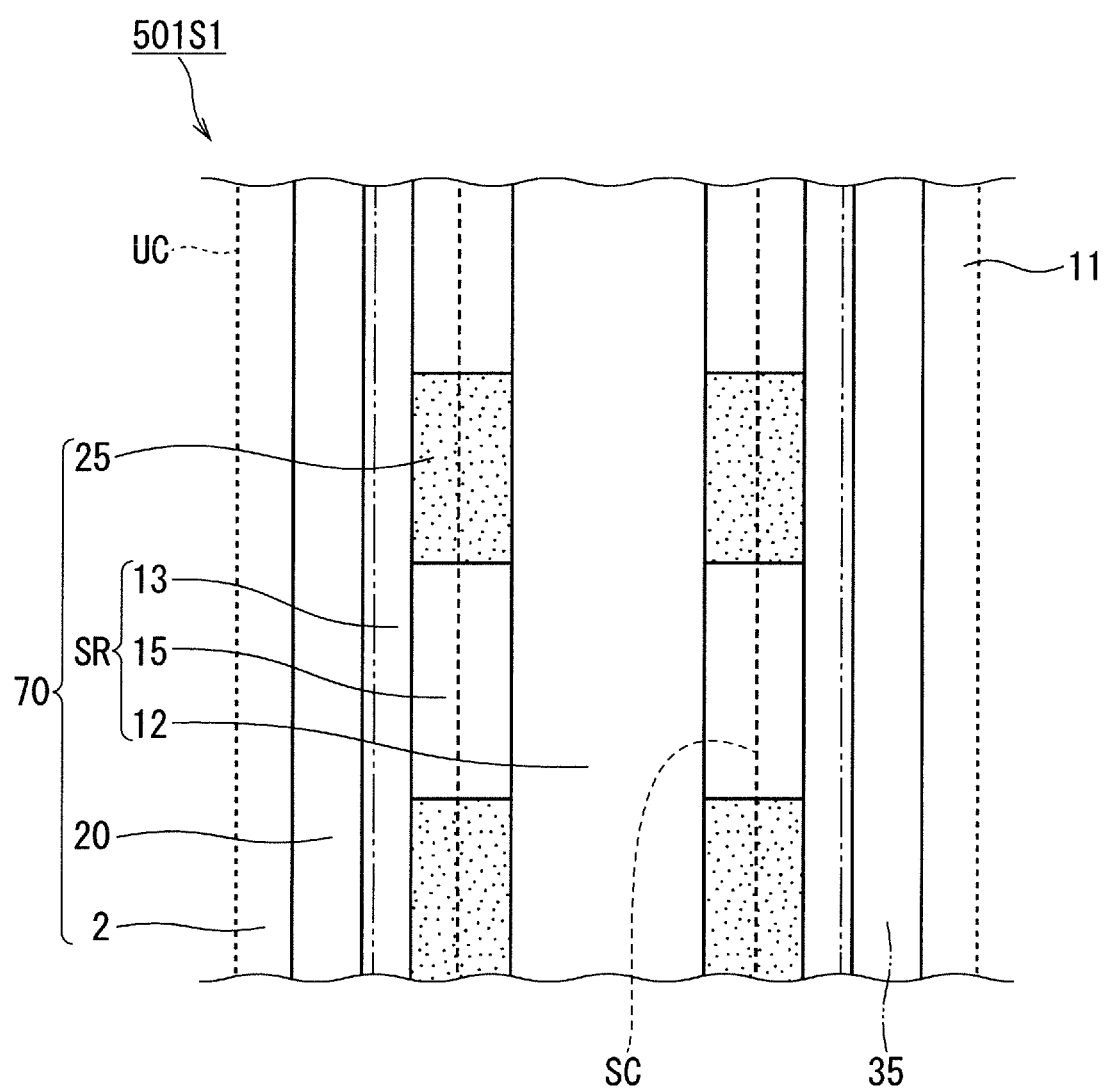
FIG. 4 is a top view showing a modification of FIG. 1.

FIG. 4 is a top view showing an MOSFET 501S1 (semiconductor device) as a modification of FIG. 1. The MOSFET 501S1 has a configuration with a plurality of unit cells UC arranged in a stripe shape (comb-like shape). One of these unit cells SC is shown in FIG. 4. Each unit cell UC extends in a direction in which the stripe shape extends (longitudinal direction in FIG. 4). The unit cells UC are aligned in a direction (transverse direction in FIG. 4) crossing this extension direction.

Each of the source contact region 12 and the source extension region 13 extends in the extension direction of the stripe shape. A region extending in the extension direction of the stripe shape is defined between the source contact region 12 and the source extension region 13, and the source resistance region 15 and the well contact region 25 are provided in this region and arranged alternately in the extension direction of the stripe shape. The well contact region 25 has parts opposite to each other across the source contact region 12 in a direction crossing the extension direction of the stripe shape, and the centers of these opposite parts may agree with each other in the extension direction of the stripe shape. In other words, these opposite parts may face each other in a direction (transverse direction in FIG. 4) vertical to the extension direction of the stripe shape.

FIG. 5 is a top view showing an MOSFET 501S2 (semiconductor device) as a modification of FIG. 4. In the MOSFET 501S2, the well contact region 25 has parts opposite to each other across the source contact region 12 in a direction crossing the extension direction of the stripe shape, and the centers of these opposite parts are shifted from each other in the direction in which the stripe shape extends. In other words, these opposite parts face each other in an oblique direction to the extension direction of the stripe shape. In this case, more uniform current density is provided in the source contact region 12. This reduces a resistance value at the source contact region 12 and improves the reliability of the MOSFET responsive to flow of a large current.

The MOSFET is not always required to have a cell structure with a plurality of unit cells UC. Additionally, a non-oxide material may be used instead of an oxide material for forming the gate insulating film. In this case, an MISFET is obtained instead of the MOSFET.

FIG. 6 is a cross-sectional view showing an MOSFET 501R (semiconductor device) as a modification of FIG. 2. While the source resistance region 15 is arranged on the surface TS of the epitaxial layer 70 in the MOSFET 501 (FIG. 2), the source resistance region 15 is separated from the surface TS of the epitaxial layer 70 in the MOSFET 501R. A separation layer 15R for separating the source contact electrode 42 of the source electrode 40 and the source resistance region 15 from each other is provided on the source resistance region 15. The separation layer 15R has the p-type. A distance between the surface TS and the source resistance region 15, in other words, the thickness of the separation layer 15R is smaller than that of the well region 20. The thickness of the well region 20 is generally equal to or less than about 2 μm, so that the thickness of the separation layer 15R is also generally equal to or less than 2 μm. The thickness of the separation layer 15R is preferably equal to or less than 200 nm and is from 100 to 200 nm, for example.

Effect of this modification will be described next. In the MOSFET 510 (FIG. 2), during formation of the source contact electrode 42 to be ohmically joined to the source contact region 12 and the well contact region 25, a part of the source resistance region 15 to contact the source contact electrode 42 may shrink to a certain degree. This unintentionally causes change in a resistance value determined by the source resistance region 15. By contrast, according to this modification, the separation layer 15R contacts the source contact electrode 42 instead of the source resistance region 15. As the separation layer 15R has the p-type, even on the occurrence of change in the thickness of the separation layer 15R, a resistance value at the source region SR made of the n-type semiconductor exhibits substantially no change. In this way, a source resistance value is stabilized according to this modification. This achieves stabilization of short-circuit tolerance.

Figure 7:
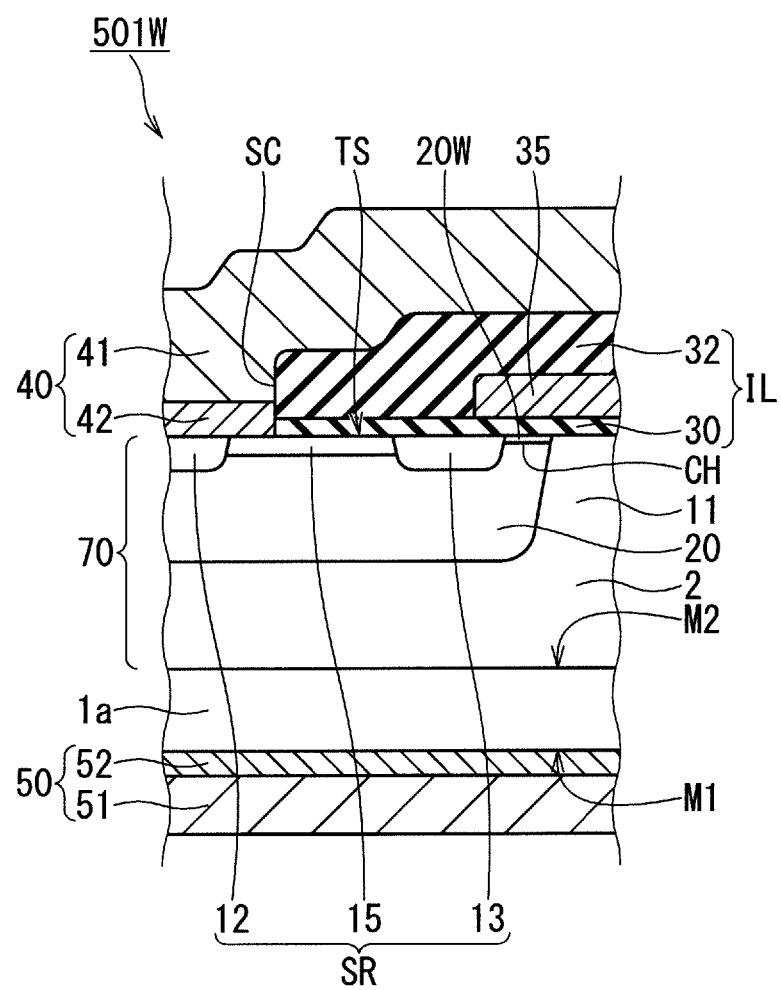
FIG. 7 is a cross-sectional view showing a modification of FIG. 2.

FIG. 7 is a cross-sectional view of an MOSFET 501W (semiconductor device) as a modification of FIG. 2. While a part of the well region 20 functioning as the channel CH is arranged on the surface TS of the epitaxial layer 70 in the MOSFET 501 (FIG. 2), a part of the well region 20 functioning as the channel CH is separated from the surface TS of the epitaxial layer 70 in the MOSFET 501W. A semiconductor layer 20W for separating the part of the well region 20 functioning as the channel CH and the surface TS from each other is provided on this part. The semiconductor layer 20W has the n-type. A distance between the surface TS and the well region 20, in other words, the thickness of the semiconductor layer 20W is equal to or less than 200 nm and about 100 nm, for example. The provision of the semiconductor layer 20W having the n-type increases the conductivity of the channel CH. In this way, an on-resistance can be reduced to a greater extent.

Figure 8:
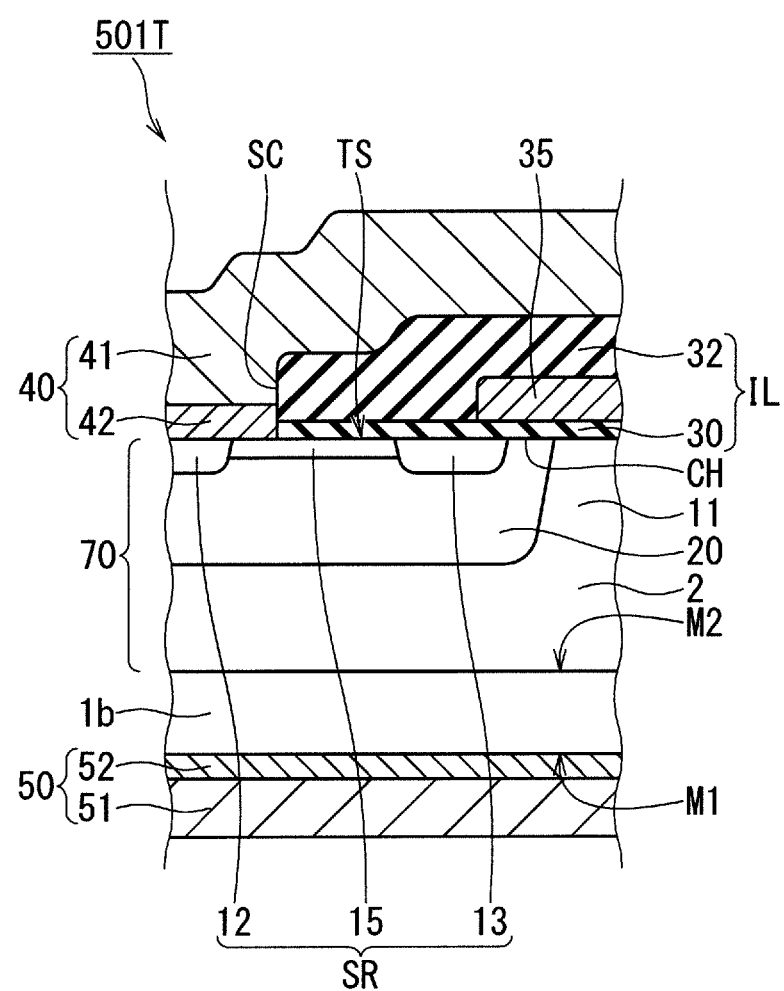
FIG. 8 is a cross-sectional view showing a modification of FIG. 2.

FIG. 8 is a cross-sectional view of an IGBT 501T (semiconductor device) as a modification of FIG. 2. The IGBT 501T includes a p-type semiconductor substrate 1b instead of the n-type semiconductor substrate 1a (FIG. 2). Thus, the conductivity type of the semiconductor substrate 1b differs from that of the drift layer 2. In the IGBT, the source region SR has a function as an emitter region, the well region 20 has a function as a base region, and the semiconductor substrate 1b has a function as a collector region. The provision of a high-resistance resistance control region (source resistance region 15) in the emitter region (source region SR) allows increase in an emitter resistance. This makes it possible to reduce current gain in a parasitic transistor formed of the emitter region (source region SR), the base region (well region 20), and the drift layer 2. As a result, it becomes possible to prevent latch up to be caused by the operation of a parasitic thyristor in the IGBT.

The epitaxial growth of the epitaxial layer 70 is not always required to be performed on the semiconductor substrate 1b. For example, the epitaxial layer 70 may be grown epitaxially on a single crystal substrate having the n-type like the semiconductor substrate 1a. Then, treatment may be performed on the epitaxial layer 70 to form the semiconductor substrate 1b having the p-type. In this case, the n-type single crystal substrate is removed at suitable timing.

(Manufacturing Method)

An exemplary method of manufacturing the MOSFET 501 will be described next by referring to the cross-sectional views in FIGS. 9 to 13. FIGS. 9 to 11 and 13 are views taken from a viewing field corresponding to that of FIG. 2. FIG. 12 is a view taken from a viewing field corresponding to that of FIG. 3.

Figure 9:
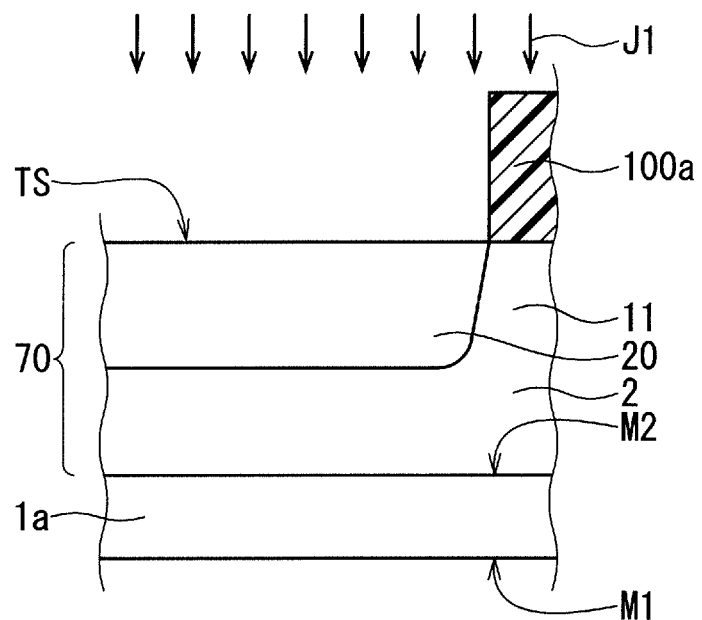
FIG. 9 is a cross-sectional view schematically showing a first step of a method of manufacturing the semiconductor device according to the first embodiment of the present invention taken from a viewing field corresponding to that of FIG. 2.

By referring to FIG. 9, the semiconductor substrate 1a made of n-type silicon carbide is prepared first. The plane direction of the semiconductor substrate 1a can be determined freely. For example, a direction vertical to the upper surface M2 of the semiconductor substrate 1a may agree with the c-axis direction or may be a direction tilted from the c-axis direction by an angle equal to or less than 8°. The thickness of the semiconductor substrate 1a may be determined freely. For example, this thickness may be about 350 μm or about 100 μm.

Next, as a result of epitaxial crystal growth of silicon carbide on the semiconductor substrate 1a, the n-type epitaxial layer 70 is formed. For example, an n-type impurity concentration in the epitaxial layer 70 is from about $1\times10^{13}$ to about $1\times10^{18}$ cm$^3$, and the thickness of the epitaxial layer 70 is from about 3 to about 200 μm. A part of the epitaxial layer 70 formed in this way and in which impurities are not to be implanted in a subsequent step becomes the drift layer 2. While an impurity concentration distribution in the epitaxial layer 70 is desirably constant in the thickness direction, it is not always required to be constant. For example, an impurity concentration may be increased or inversely, reduced intentionally in the vicinity of the surface TS. Increasing an impurity concentration in the vicinity of the surface TS achieves the effects of reducing a resistance in the JFET region 11 to be formed later and improving channel mobility. This further makes it possible to set a low threshold voltage for switching of the MOSFET 501. Inversely, reducing an impurity concentration in the vicinity of the surface TS reduces electric field to be applied to the gate insulating film 30 in response to application of a reverse bias to the MOSFET 501, thereby improving reliability. This further makes it possible to set a high threshold voltage.

Next, an implantation mask 100a is formed using photolithography process. The implantation mask 100a is a resist film or a silicon oxide film, for example. Next, selective ion implantation (arrows J1 in FIG. 9) is performed using the implantation mask 100a to form the p-type well region 20. The semiconductor substrate 1a is preferably heated at a temperature from 100 to 800° during the ion implantation. Alternatively, the semiconductor substrate 1a is not required to be heated. P-type impurities (acceptors) to be implanted are preferably aluminum or boron. The depth position of the bottom of the well region 20 is set in such a manner as not to reach the bottom of the drift layer 2 (namely, the upper surface M2 of the semiconductor substrate 1a), and is set at a position from about 0.2 to about 2.0 μm from the surface TS, for example. A maximum impurity concentration in the well region 20 is set within a range from $1\times10^{15}$ to $1\times10^{19}$ cm$^3$, for example, which exceeds an impurity concentration in the vicinity of a surface of the drift layer 2. The MOSFET 501W (FIG. 7) according to the modification can be obtained by implanting ions in such a manner that the concentration of impurities implanted into the vicinity of the surface TS falls below an impurity concentration in the epitaxial layer 70. Next, the implantation mask 100a is removed.

Figure 10:
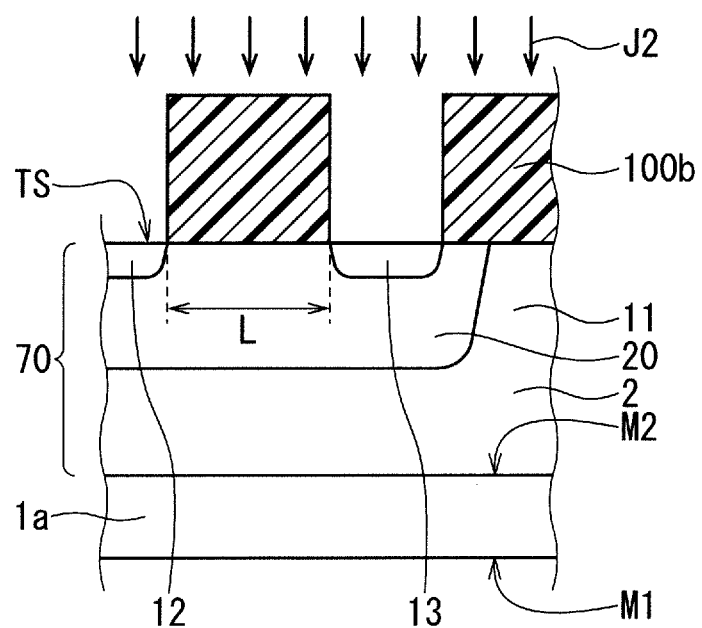
FIG. 10 is a cross-sectional view schematically showing a second step of the method of manufacturing the semiconductor device according to the first embodiment of the present invention taken from a viewing field corresponding to that of FIG. 2.

Referring to FIG. 10, an implantation mask 100b is formed next using photolithography process. The implantation mask 100b is a resist film or a silicon oxide film, for example. Next, selective ion implantation (arrows J2 in FIG. 10) is performed using the implantation mask 100b to form the n-type source contact region 12 and source extension region 13. N-type impurities (donors) to be implanted are preferably nitride or phosphorus. The implantation mask 100b has respective openings for a region for forming the source contact region 12 and for a region for forming the source extension region 13, so that the resultant source contact region 12 and source extension region 13 are separated from each other. A length L of the source resistance region 15 to be formed later is defined by a distance between the opening for the region for forming the source contact region 12 and the opening for the region for forming the source extension region 13 in the implantation mask 100b. The length L is from 0.1 to 10 μm, for example. In terms of preventing reduction in channel width density by preventing excessive increase in the cell pitch of the unit cell UC, the length L is preferably within a range from 0.1 to 3 μm. The depth position of the bottom of each of the source contact region 12 and the source extension region 13 is set in such a manner as not to reach the bottom of the well region 20. An n-type impurity concentration in each of the source contact region 12 and the source extension region 13 exceeds the p-type impurity concentration in the well region 20. A maximum of this n-type impurity concentration is set from about $1\times10^{18}$ to about $1\times10^{21}$ cm$^3$. Forming the source contact region 12 and5 the source extension region 13 simultaneously in this way makes it possible to suppress fluctuation of the length L, compared to forming the source contact region 12 and the source extension region 13 individually. This also reduces the number of process steps to contribute to reduction in manufacturing cost. Next, the implantation mask 100b is removed.

Figure 11:
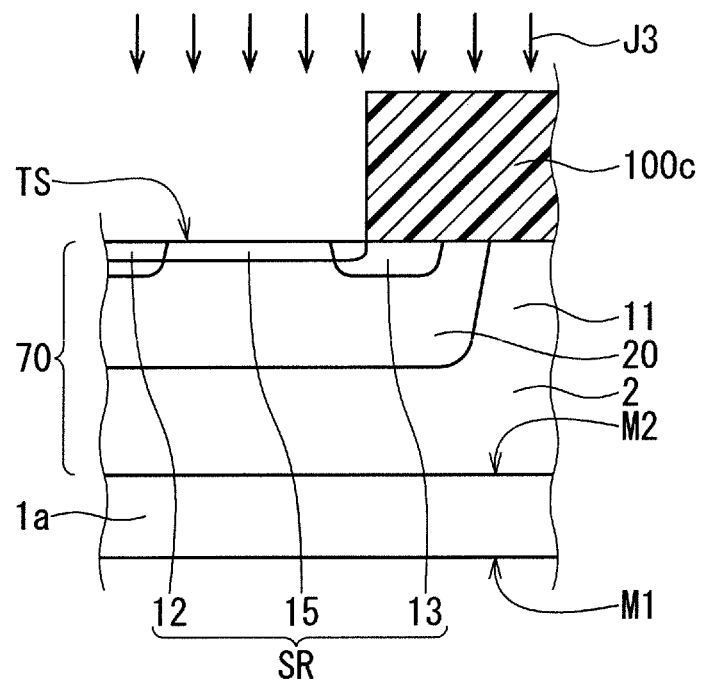
FIG. 11 is a cross-sectional view schematically showing a third step of the method of manufacturing the semiconductor device according to the first embodiment of the present invention taken from a viewing field corresponding to that of FIG. 2.
Figure 12:
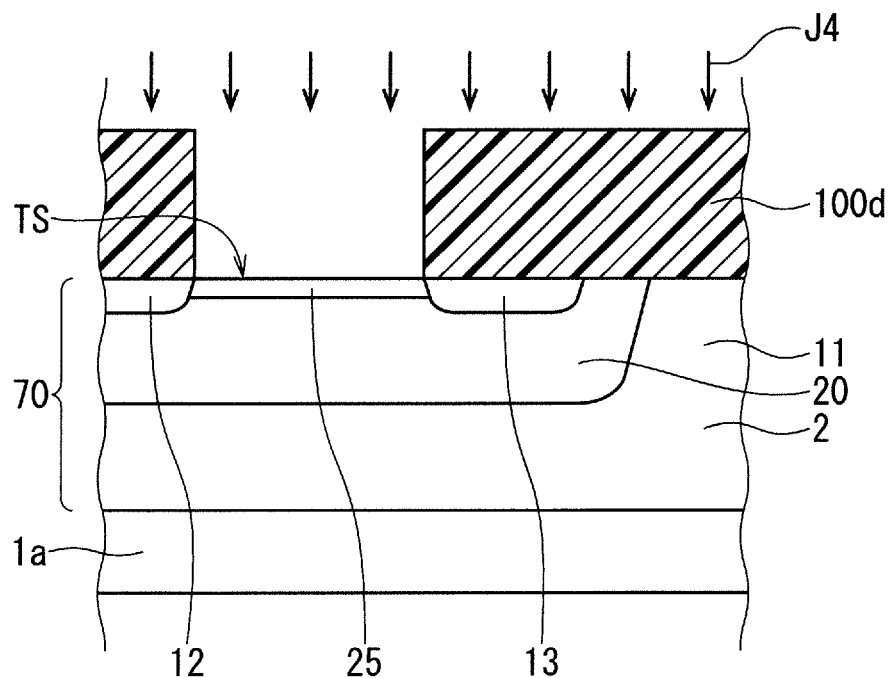
FIG. 12 is a cross-sectional view schematically showing a fourth step of the method of manufacturing the semiconductor device according to the first embodiment of the present invention taken from a viewing field corresponding to that of FIG. 3.

Referring to FIG. 11, an implantation mask 100c is thereafter formed using photolithography process. The implantation mask 100c is a resist film, for example. Next, selective ion implantation (arrows J3 in FIG. 11) is performed using the implantation mask 100c to form the n-type source resistance region 15. While the source resistance region 15 drawn in FIG. 11 is shown to overlap the source contact region 12 and the source extension region 13 in order to make a range of the ion implantation easily viewable, the length of the source resistance region 15 is defined as a distance of the separation between the source contact region 12 and the source extension region 13. The ion implantation is performed in such a manner that an impurity concentration in the source resistance region 15 becomes smaller by an order of magnitude or more than the impurity concentration in the source contact region 12 or the source extension region 13. The thickness of the source resistance region 15 (a dimension in a direction vertical to the in-plane direction of the semiconductor substrate 1a) is preferably from about 0.1 to about 3.0 μm. The length of the source resistance region 15 (a dimension in the in-plane direction of the semiconductor substrate 1a) is preferably from about 0.1 to about 5 μm. This ion implantation may be performed in one stage, or in two or more stages. An impurity concentration distribution in the source resistance region 15 in the depth direction may be a retrograde profile or a stepped profile with two or more steps. As a result of implementation of this step, the source resistance region 15 having a relatively low n-type impurity concentration is inserted into the source region SR. This allows a resistance in the source region SR to be increased intentionally by an intended degree, and particularly, achieves modulating effect comparable to or higher than an on-resistance in the MOSFET. On the other hand, the n-type impurity concentration in each of the source contact region 12 and the source extension region 13 is set to be relatively high for encouraging reduction in a parasitic resistance in the MOSFET, and further, reduction in a constant resistance with the source contact electrode 42. As a result, sheet resistances in the source contact region 12 and the source extension region 13 are reduced. Next, the implantation mask 100c is removed.

Referring to FIG. 12, an implantation mask 100d is thereafter formed using photolithography process. Next, selective ion implantation (arrows J4 in FIG. 12) is performed using the implantation mask 100d to form the p-type well contact region 25. As described above, FIG. 12 is a view taken from a viewing field corresponding to that of FIG. 3 not a viewing field corresponding to that of FIG. 2, and shows a cross section different from the cross-section of FIG. 11. The well contact region 25 is formed in such a manner that the bottom of the well contact region 25 reaches the well region 20. To obtain favorable connection between the well region 20 and the source contact electrode 42, the well contact region 25 is formed in such a manner as to have a p-type impurity concentration higher than the p-type impurity concentration in the well region 20. This ion implantation is desirably performed at a substrate temperature equal to or more than 150° C. In this case, the resultant well contact region 25 is allowed to have a low sheet resistance.

The lengths, depths, and impurity concentrations of the regions, and an area ratio between these regions formed by the implementation of the steps shown in FIGS. 9 to 12 can be set appropriately in consideration of required short-circuit tolerance, dimensional fluctuation, etc. The order of the foregoing ion implantation steps can be changed.

Then, thermal treatment is performed for electrically activating the impurities implanted in the epitaxial layer 70. This thermal treatment is preferably performed in an atmosphere of inert gas such as argon or nitrogen or in a vacuum, at a temperature from 1500 to 2200°, and for a duration of 0.5 to 60 minutes. During implementation of the thermal treatment, a carbide film covering the surface TS of the epitaxial layer 70 may be provided temporarily. In addition to covering the surface TS, this carbide film may cover the lower surface of the semiconductor substrate 1a and end surfaces of the epitaxial layer 70 and the semiconductor substrate 1a. This makes it possible to prevent roughening of the surface of the epitaxial layer 70 to be caused by etching resulting from reaction with moisture or oxygen remaining in a chamber of a thermal treatment apparatus.

Next, a silicon oxide film (not shown in the drawings) is formed as a sacrificial oxide film on the surface TS of the epitaxial layer 70 through thermal oxidation. Then, this silicon oxide film is removed with hydrofluoric acid. As a result of implementation of this step, a machining damaged layer on the surface TS is removed to obtain the clean surface TS. Then, a silicon oxide film (not shown in the drawings) is formed on the epitaxial layer 70 using a technique such as chemical vapor deposition (CVD). This silicon oxide film is patterned to form an opening in a part of the surface TS to become an active region. By doing so, a field oxide film (not shown in the drawings) is formed outside the active region. The thickness of the field oxide film is from about 0.5 to about 2 μm, for example.

Next, a silicon oxide film is formed as the gate insulating film 30 on the surface TS of the epitaxial layer 70. The silicon oxide film is formed by a technique such as thermal oxidation technique or a deposition technique, for example. The resultant silicon oxide film may be subjected to thermal treatment. As an atmosphere of the thermal treatment, an atmosphere of nitride oxide gas (NO or $N_2O$, for example), an ammonia atmosphere, or an atmosphere of inert gas (argon, for example) is applicable.

Figure 13:
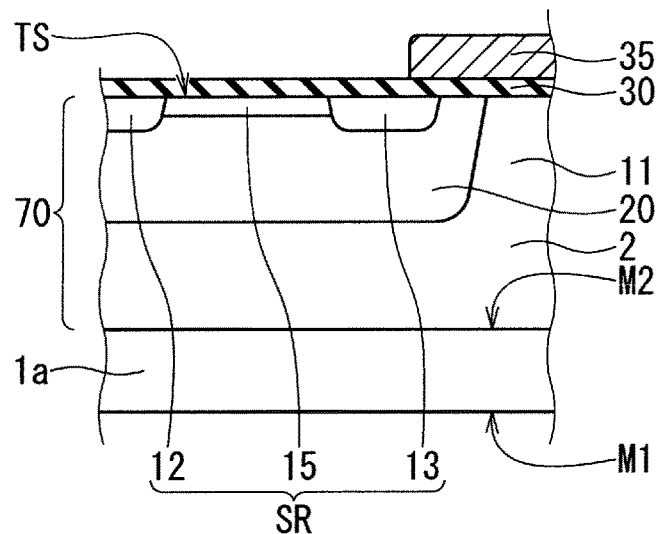
FIG. 13 is a cross-sectional view schematically showing a fifth step of the method of manufacturing the semiconductor device according to the first embodiment of the present invention taken from a viewing field corresponding to that of FIG. 2.

Next, to form the gate electrode 35, polycrystalline silicon or polycrystalline silicon carbide is deposited by a CVD technique on the gate insulating film 30. Polycrystalline silicon or polycrystalline silicon carbide is desirably a low-resistance material given the n-type or the p-type as a result of inclusion of phosphorus, boron, or aluminum as dopants. The dopants may be taken in during the deposition, or may be added by ion implantation and activation thermal treatment after the deposition. A material of the gate electrode 35 may be metal, an intermetallic compound, or a multilayer film containing metal and an intermetallic compound. This deposited layer is patterned using photolithography process and etching to form the gate electrode 35. As a result, the structure shown in FIG. 13 is obtained.

Referring again to FIGS. 2 and 3, the interlayer insulating film 32 is formed on the surface TS of the epitaxial layer 70 by a CVD process, for example. Then, using a dry etching technique, for example, the contact hole SC (source contact hole) for connecting the source electrode 40 to the source contact region 12 and the well contact region 25 is formed in the insulating layer IL including the gate insulating film 30 and the interlayer insulating film 32. Further, in a region not shown in the drawings, a contact hole (gate contact hole) for connecting a gate line (not shown in the drawings) to the gate electrode 35 is formed in the interlayer insulating film 32. The source contact hole and the gate contact hole may be formed simultaneously in the same etching step. This simplifies process steps to achieve reduction in manufacturing cost.

Then, the source contact electrode 42 is formed in a part of the surface TS of the epitaxial layer 70 exposed at the bottom of the contact hole SC. The source contact electrode 42 realizes ohmic contact with the source contact region 12 and the well contact region 25. If the epitaxial layer 70 is made of silicon carbide, the source contact electrode 42 is formed by a method in which a metal film mainly containing Ni is first formed on the entire surface of the semiconductor substrate 1a subjected to the foregoing steps. This metal film contacts the surface TS of the epitaxial layer 70 at the bottom of the contact hole SC. Next, thermal treatment is performed at a temperature from 600 to 1100° to cause reaction between the metal film and silicon carbide, thereby forming a silicide film to become the source contact electrode 42. Then, the metal film remaining unreacted on the interlayer insulating film 32 is removed by wet etching using nitric acid, sulfuric acid, hydrochloric acid, or mixed solutions containing such acids and hydrogen peroxide solution. Thermal treatment may thereafter be performed again. By performing this thermal treatment at a higher temperature than the temperature for the thermal treatment performed previously, the ohmic contact is formed at a lower contact resistance.

As described above, the source contact electrode 42 is formed in such a manner as to contact the source resistance region 15. If the unit cell UC has a stripe shape, patterning may be performed in order to prevent contact of the source contact electrode 42 with the source resistance region 15.

If the gate contact hole (not shown in the drawings) is formed before implementation of the step of forming the source contact electrode 42, an ohmic electrode made of silicide is further formed on the bottom of the gate contact hole. If the gate contact hole is not formed before implementation of the step of forming the source contact electrode 42, the source contact electrode 42 is formed and then etching is performed for forming the gate contact hole in the interlayer insulating film 32.

The source contact electrode 42 may entirely be made of the same intermetallic compound. Alternatively, a part of the source contact electrode 42 to be connected to a p-type region and a part of the source contact electrode 42 to be connected to an n-type region may be made of different intermetallic compounds suitable for the respective parts. Providing an ohmic contact resistance to the source contact electrode 42 sufficiently low for contact with the n-type source contact region 12 is important for reducing an on-resistance in the MOSFET. On the other hand, providing an ohmic contact resistance to the source contact electrode 42 sufficiently low for contact with the p-type well contact region 25 is preferable in terms of fixing of the well region 20 to a ground potential and improving the forward direction characteristics of a body diode buried in the MOSFET.

During formation of the source contact electrode 42 on the epitaxial layer 70, a silicide film to become the drain contact electrode 52 is further formed on the lower surface M1 of the semiconductor substrate 1a using the same technique. The drain contact electrode 52 ohmically contacts the semiconductor substrate 1a to realize favorable electrical connection between the semiconductor substrate 1a and the electrode layer 51 to be formed later.

Then, using sputtering process or vapor deposition process, for example, a metal film is formed. This metal film is patterned to form the electrode layer 41 on the interlayer insulating film 32. The gate line (not shown in the drawings) to be connected to the gate electrode 35 is formed of the same metal film as the electrode layer 41. Examples of a material of this metal film include Al, Ag, Cu, Ti Ni, Mo, W, Ta, nitrides of these metals, and alloys of these metals. The metal film may be a stacked film formed by using a plurality of different materials. Further, a metal film made of Ti, Ni, Ag, or Au, for example, is deposited on the source contact electrode 42 on the lower surface M1 of the semiconductor substrate 1a to form the electrode layer 51. As a result of the foregoing, the MOSFET 501 shown in FIGS. 2 and 3 is obtained.

A protective film (not shown in the drawings) covering the MOSFET 501 formed by the foregoing method may be provided. A silicon nitride film or a polyimide film is used as the protective film, for example. The protective film is given openings for connection of an external control circuit to the source electrode 40 and the gate line. Specifically, a part of the electrode layer 41 and a part of the gate line exposed at the openings of the protective film are used as pads for external connection, more specifically, as a source pad and a gate pad.

Alternatively, after the protective film is formed during implementation of the foregoing steps, the semiconductor substrate 1a may be polished from the back surface to be reduced in thickness to about 100 μm. In this case, the drain electrode 50 is formed after formation of the protective film. More specifically, the polished surface described above is cleaned. Next, a metal film mainly containing Ni is formed on the entire lower surface M1 of the semiconductor substrate 1a. Then, a silicide film is formed on the back surface of the semiconductor substrate 1a using local heating process such as laser annealing, thereby forming the drain contact electrode 52. Then, like in the foregoing step, a metal film made of Ti, Ni, Ag, or Au, for example, is formed on the drain contact electrode 52 to form the electrode layer 51.

According to the first embodiment, the source resistance region 15 formed in the different step from the source contact region 12 and the source extension region 13 is inserted in series into a path from the channel CH of the well region 20 to the source contact electrode 42 and the electrode layer 41. This means that an effective source resistance can be changed by changing an impurity concentration in the source resistance region 15.

A drain saturation current influences the magnitude of short-circuit tolerance and is proportionate to the square of a gate-to-source voltage applied to the channel CH. In the presence of a significant source resistance like in the first embodiment, an effective gate-to-source voltage is reduced by the product of a source resistance and a drain current. Thus, increasing the source resistance reduces the saturation current to achieve increase in short-circuit tolerance.

On the other hand, an excessive source resistance is unfavorable as it increases conduction loss in an on-state during normal operation in the absence of abnormality such as a load short-circuit (hereinafter also called "normal on-state" simply). In particular, if an n-type impurity concentration in the source region is substantially uniform in the in-plane direction, increasing a source resistance causes increase in contact resistance between the source region and the source contact electrode, thereby causing more serious element loss. According to the first embodiment, a low contact resistance is formed between the source contact electrode 42 and the source contact region 12 as described above. This allows setting of a source resistance in such a manner as to reduce a saturation current while excessive increase in an on-resistance is suppressed.

If silicon is used as a semiconductor material in production of a semiconductor device having an MOS structure, after formation of a gate electrode, self-aligned process of performing ion implantation and activation annealing is employed widely for forming a source region. However, such process is not applicable if silicon carbide is used as a semiconductor material. Hence, as a result of misregistration occurring between photolithography process for forming the source region SR and photolithography process for forming the gate electrode 35, misalignment occurs between the source region SR and the gate electrode 35. In this regard, while carriers are accumulated in an MOS interface during on operation to result in a low resistance in a part of the source region SR overlapping the gate electrode 35, a sheet resistance itself influences a source resistance in a part of the source region SR not overlapping the gate electrode 35. Thus, the source resistance in the part of the source region SR not overlapping the gate electrode 35 contributes to reduction in saturation current. The length of the part of the source region SR not overlapping the gate electrode 35 depends on the accuracy of alignment between the source region SR and the gate electrode 35, namely, the foregoing misregistration.

If an n-type impurity concentration in a source region is substantially uniform in the in-plane direction, the misregistration may cause fluctuation of a source resistance in a unit cell. More specifically, if a part of the source region not overlapping a gate electrode becomes shorter, the source resistance is reduced. If the part of the source region not overlapping the gate electrode becomes longer, the source resistance is increased. Fluctuation of the source resistance influences an effective gate voltage to be applied to a channel, causing imbalance of a saturation current value at the unit cell.

By contrast, according to the first embodiment, the source extension region 13 corresponds to the part of the source region SR overlapping the gate electrode 35, and a low sheet resistance is set in the source extension region 13 in order to reduce effective influence on gate voltage reduction. On the other hand, the source resistance region 15 having a high sheet resistance does not overlap the gate electrode 35. The length of the source resistance region 15, namely, an interval between the source contact region 12 and the source extension region 13 is determined by the length L of the implantation mask 100b (FIG. 10) formed in one photolithography process, and does not depend on positioning accuracy. In this way, the occurrence of imbalance of a saturation current can be prevented in the unit cell UC.

In particular, if silicon carbide is used as a semiconductor material in production of a semiconductor device having an MOS structure, thermally oxidizing a region with impurities implanted at a high concentration is known to cause a phenomenon of oxidizing this region at a higher speed than the other regions, namely, accelerated oxidation. According to the first embodiment, a part of the source region SR forming the MOS structure at a terminal portion of the gate electrode 35 corresponds to the source extension region 13, not the source resistance region 15. The source extension region 13 has a low sheet resistance, namely, a high impurity concentration. For this reason, only a part of the gate insulating film 30 located on the source region SR can be increased in thickness during formation of the gate insulating film 30 by thermal oxidation. In this way, the thickness of the gate insulating film 30 is increased at the terminal portion of the gate electrode 35. Thus, electric field applied to the gate insulating film 30 is weakened at the terminal portion of the gate electrode 35. As a result, the reliability of the MOS structure can increased.

If silicon carbide is used as a semiconductor material in production of a semiconductor device having an MOS structure, the temperature dependence of a channel resistance may become more notable as a result of influence such as an interface state of the MOS structure than the temperature dependence of the source resistance region 15 formed by ion implantation. To ensure intended short-circuit tolerance in this case, compared to increasing a channel resistance by increasing a channel length, forming the source resistance region 15 in such a manner as to make the source resistance region 15 longer than the channel length while reducing the channel length to the lowest possible level may result in suppression of increase in an on-resistance, particularly at room temperature or at lower temperature. Further, making the source resistance region 15 sufficiently long allows suppression of fluctuation of a resistance value to be caused by fluctuation of the length of the source resistance region 15. By suppressing a channel length and forming the source resistance region 15 into a length longer than the channel length in this way, it becomes possible to improve the performance of the MOSFET to a greater extent.

Second Embodiment

Figure 14:
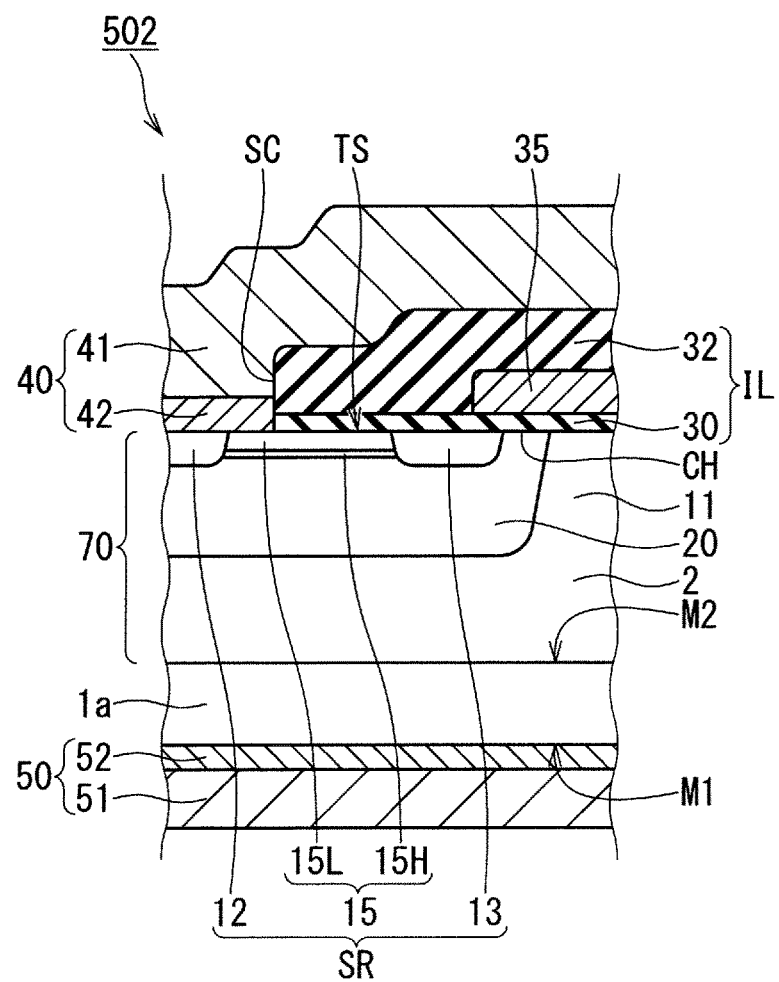
FIG. 14 is a cross-sectional view schematically showing the configuration of a semiconductor device according to a second embodiment of the present invention taken from a viewing field similar to that of FIG. 2.

FIG. 14 is a cross-sectional view schematically showing the configuration of an MOSFET 502 (semiconductor device) according to a second embodiment taken from a viewing field similar to that of FIG. 2. In the MOSFET 502, the source resistance region 15 includes a high-concentration part 15H (first part) arranged on the well region 20, and a low-concentration part 15L (second part) arranged on the high-concentration part 15H. The high-concentration part 15H is located between the low-concentration part 15L and the well region 20. The high-concentration part 15H has a resistivity lower than that of the low-concentration part 15L. These resistivities may be obtained by setting an impurity concentration in the high-concentration part 15H to be higher than an impurity concentration in the low-concentration part 15L.

The high-concentration part 15H may be formed by ion implantation using a dedicated mask. Alternatively, the high-concentration part 15H may be formed by ion implantation using a mask common to the low-concentration part 15L. In this case, the low-concentration part 15L is formed by applying relatively low implantation energy and the high-concentration part 15H is formed by applying relatively high implantation energy. Using the common mask allows simplification of a manufacturing method.

Structures other than the foregoing structures are substantially the same as those of the first embodiment described above. Thus, corresponding or comparable structures will be given the same sign and will not be described repeatedly.

If the thickness of the high-concentration part 15H is substantially equal to or less than the thickness of a depletion layer at a pn junction between the high-concentration part 15H and the well region 20, the following effect is achieved. In a normal on-state, extension of the depletion layer into the low-concentration part 15L is limited, and this suppresses increase in an on-resistance in the MOSFET. On the occurrence of a load short-circuit, voltage drop occurring at the low-concentration part 15L reduces a saturation current, and this improves the short-circuit tolerance of the MOSFET. As a result, a trade-off between the short-circuit tolerance and an on-resistance is improved.

In particular, if the size of the unit cell UC is required to be reduced, the length of the source resistance region 15 is also desired to be reduced. To reduce the length of the source resistance region 15 while an intended resistance is ensured, a low impurity concentration is required in the source resistance region 15. In this regard, reducing an impurity concentration in the entire source resistance region 15 excessively causes rapid increase in an on-resistance as a result of the foregoing extension of the depletion layer. According to the second embodiment, such rapid increase in an on-resistance can be prevented.

By contrast, if the thickness of the high-concentration part 15H is larger than the thickness of the depletion layer at the pn junction between the high-concentration part 15H and the well region 20, in other words, if the high-concentration part 15H is not depleted completely, the following effect is achieved. On the occurrence of a load short-circuit, as a result of voltage drop mainly occurring at the high-concentration part 15H, a reverse bias is applied between the low-concentration part 15L and the well region 20 to extend the depletion layer. This extension of the depletion layer narrows a current path. This achieves the effect of increasing a resistance further in the low-concentration part 15L, namely, resistance modulating effect.

If the high-concentration part 15H contacts the well region 20 having an impurity concentration higher by a certain extent than an impurity concentration in the high-concentration part 15H, this resistance modulating effect becomes more notable with increase in the impurity concentration in the high-concentration part 15H. Thus, on condition that the high-concentration part 15H is not depleted completely, increasing the impurity concentration in the high-concentration part 15H achieves higher resistance modulating effect in the low-concentration part 15L. To form the low-concentration part 15L achieving high resistance modulating effect, the thickness of the high-concentration part 15H is preferably as small as possible within a range of not causing complete depletion in a normal on-state.

While the upper end and the lower end of the high-concentration part 15H are at shallower depth positions than those of the respective lower ends of the source contact region 12 and the source extension region 13 in the configuration shown in FIG. 14, a different configuration may be employed. More specifically, at least one of the respective lower ends of the source contact region 12 and the source extension region 13 may be at a depth position between the depth position of the upper end and the depth position of the lower end of the high-concentration part 15H. Alternatively, the upper end of the high-concentration part 15H may be at a depth position deeper than the depth position of at least one of the respective lower ends of the source contact region 12 and the source extension region 13.

Third Embodiment

Figure 15:
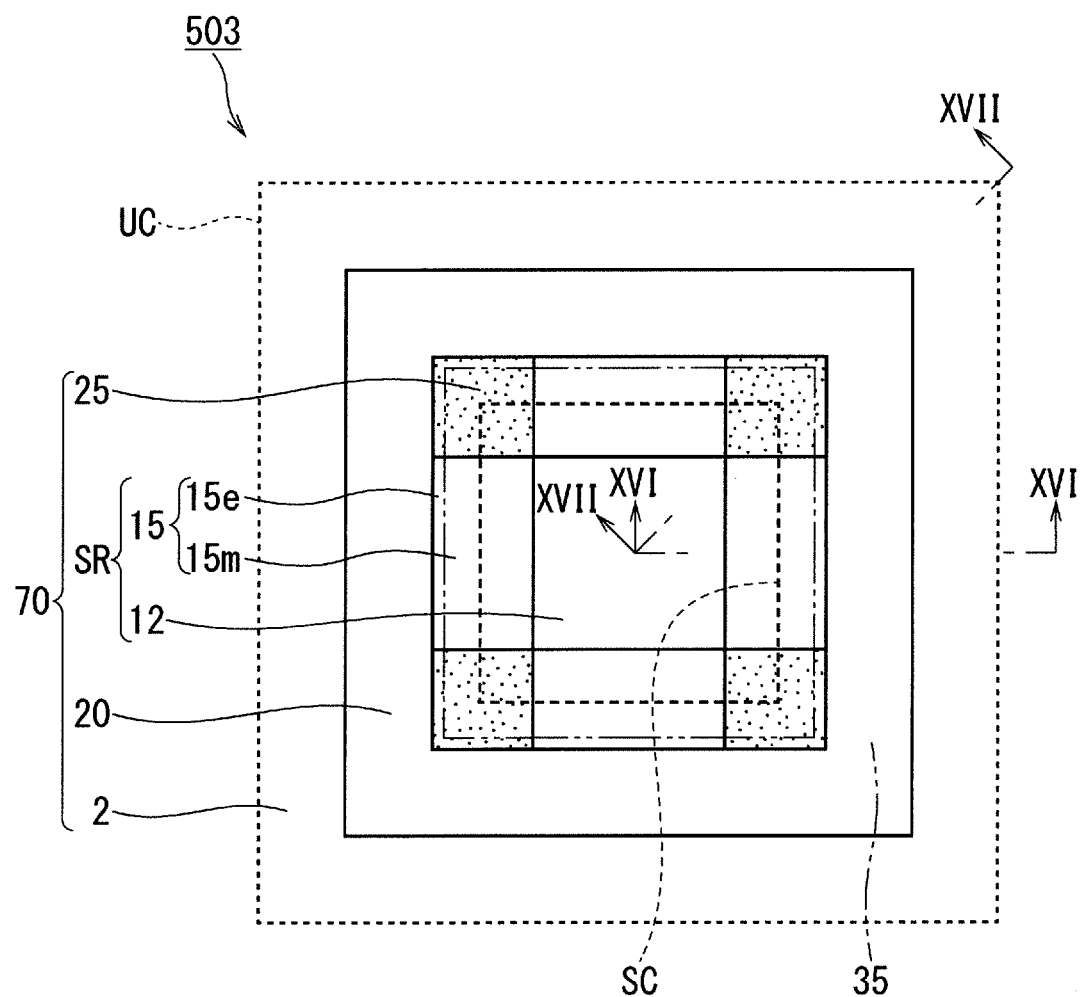
FIG. 15 is a top view schematically showing the configuration of a semiconductor layer in a unit cell of a semiconductor device according to a third embodiment of the present invention.
Figure 16:
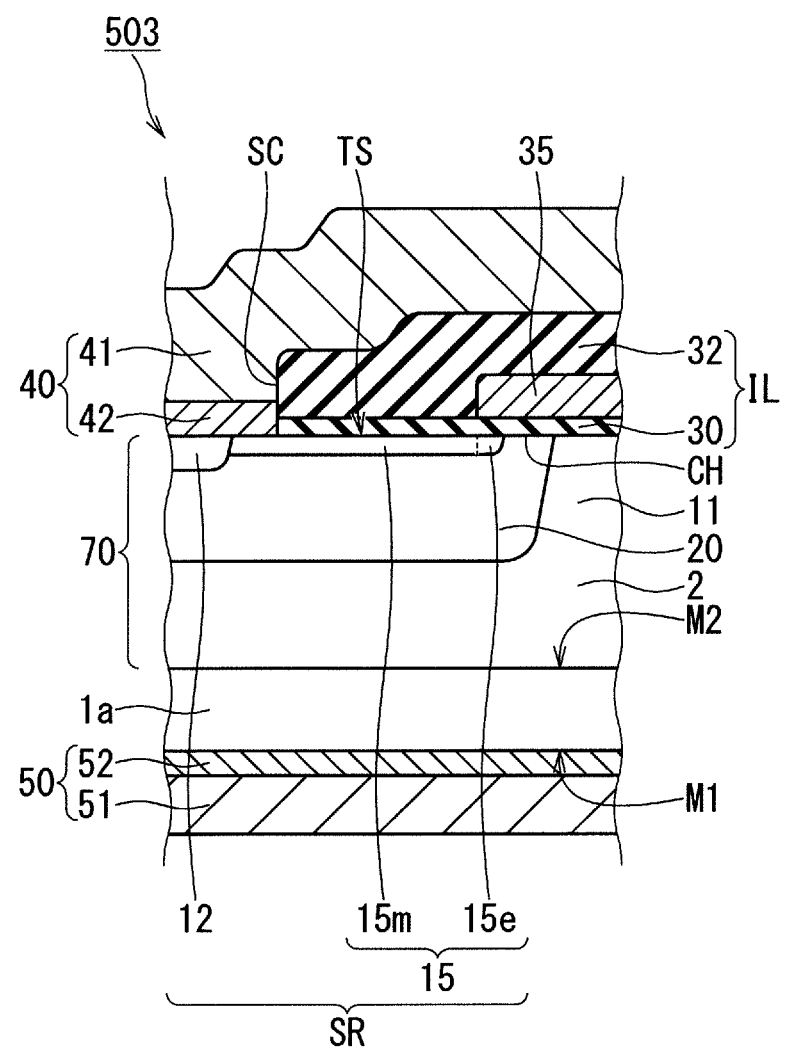
FIG. 16 is a cross-sectional view schematically showing the configuration of the semiconductor device according to the third embodiment of the present invention at a cross section taken along a line XVI-XVI in FIG. 15.
Figure 17:
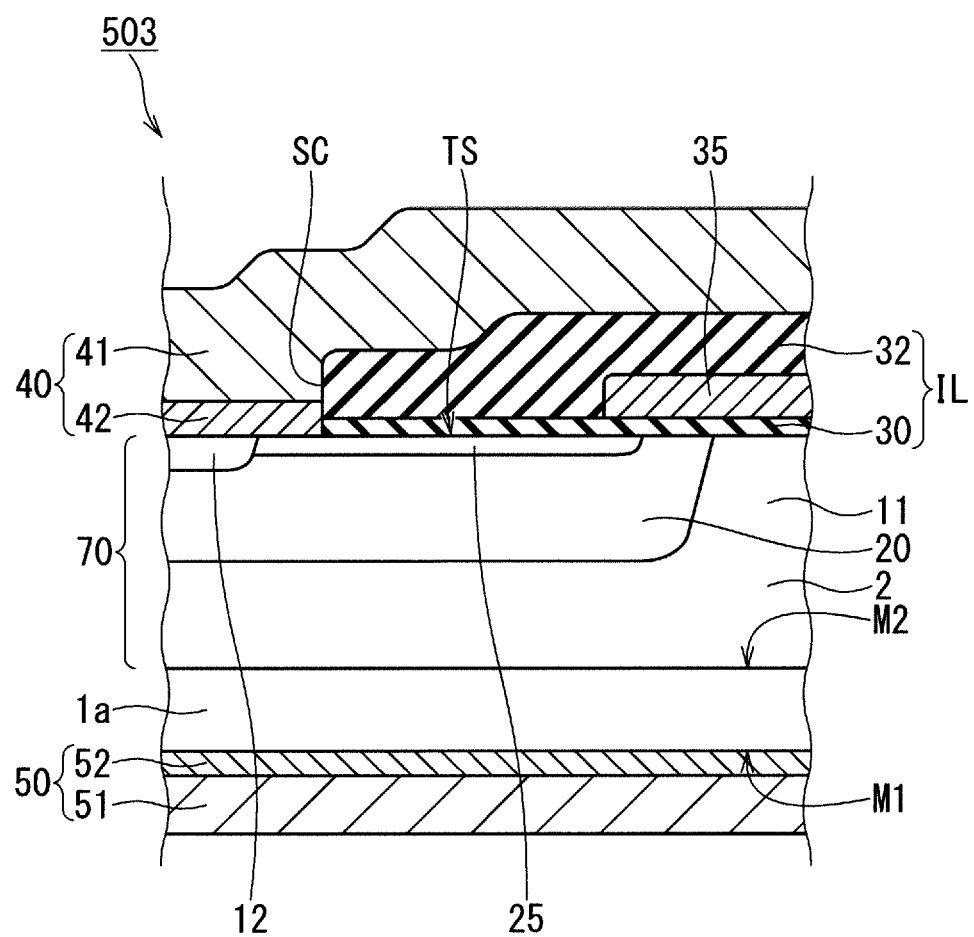
FIG. 17 is a cross-sectional view schematically showing the configuration of the semiconductor device according to the third embodiment of the present invention at a cross section taken along a line XVII-XVII in FIG. 15.

FIG. 15 is a top view schematically showing the configuration of a semiconductor layer (epitaxial layer 70 in FIGS. 16 and 17) in a unit cell UC of an MOSFET 503 (semiconductor device) according to a third embodiment. FIGS. 16 and 17 are cross-sectional views schematically showing the configuration of the MOSFET 503 at cross sections taken along a line XVI-XVI and a line XVII-XVII in FIG. 15 respectively.

In the MOSFET 503, the source region SR is formed of the source contact region 12 and the source resistance region 15. Namely, the source extension region 13 described in the first embodiment is not provided. In a plan view (FIG. 15), the source extension region 13 (FIG. 1: first embodiment) is omitted by arranging each region in such a manner that the outer periphery of the source resistance region 15 and the well region 20 (channel CH) contact each other. The source resistance region 15 of the third embodiment includes an effective part 15*m* not overlapping the gate electrode 35 in a plan view, and an overlapping part 15*e* overlapping the gate electrode 35 in a plan view.

Structures other than the foregoing structures are substantially the same as those of the first embodiment or the second embodiment described above. Thus, corresponding or comparable structures will be given the same sign and will not be described repeatedly.

According to the third embodiment, the pitch length of the unit cell UC can be reduced. This achieves increase in a current allowed to flow per unit area in the MOSFET.

Figure 18:
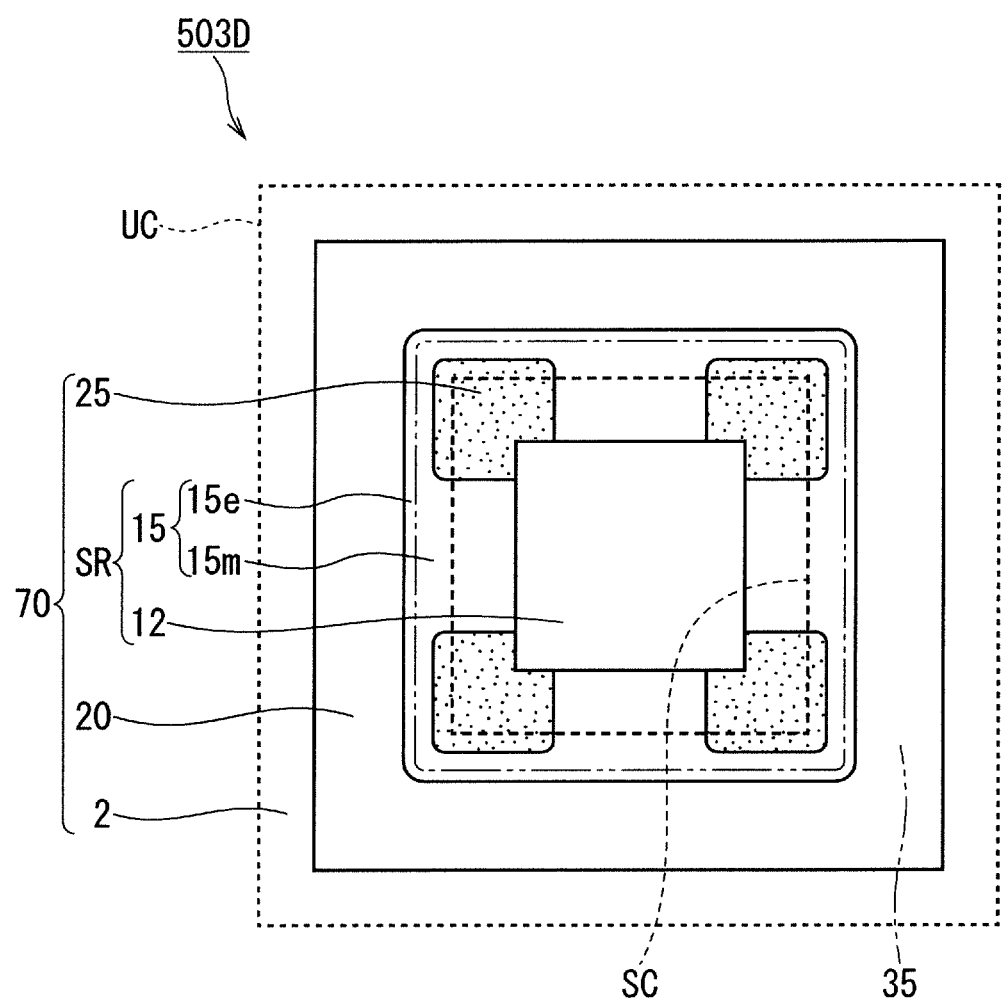
FIG. 18 is a top view showing a modification of FIG. 15.

FIG. 18 is a top view showing an MOSFET 503D (semiconductor device) as a modification of FIG. 15. In the MOSFET 503D, unlike in the MOSFET 503 (FIG. 15), the well contact region 25 is arranged in such a manner as not to have a part contacting the gate electrode 35 with only the gate insulating film 30 interposed therebetween. More specifically, in comparison to the pattern of FIG. 15, the well contact region 25 is shifted toward the center of the unit cell UC in the presence of the source contact region 12 in the pattern of FIG. 18.

According to this modification, the reliability of the gate insulating film 30 (see FIGS. 16 and 17) can be increased to a greater extent. Further, as the source resistance region 15 contacts the well region 20 at a sufficient length of the source resistance region 15, increase in a resistance in the channel CH can be suppressed.

Fourth Embodiment (Configuration)

Figure 20:
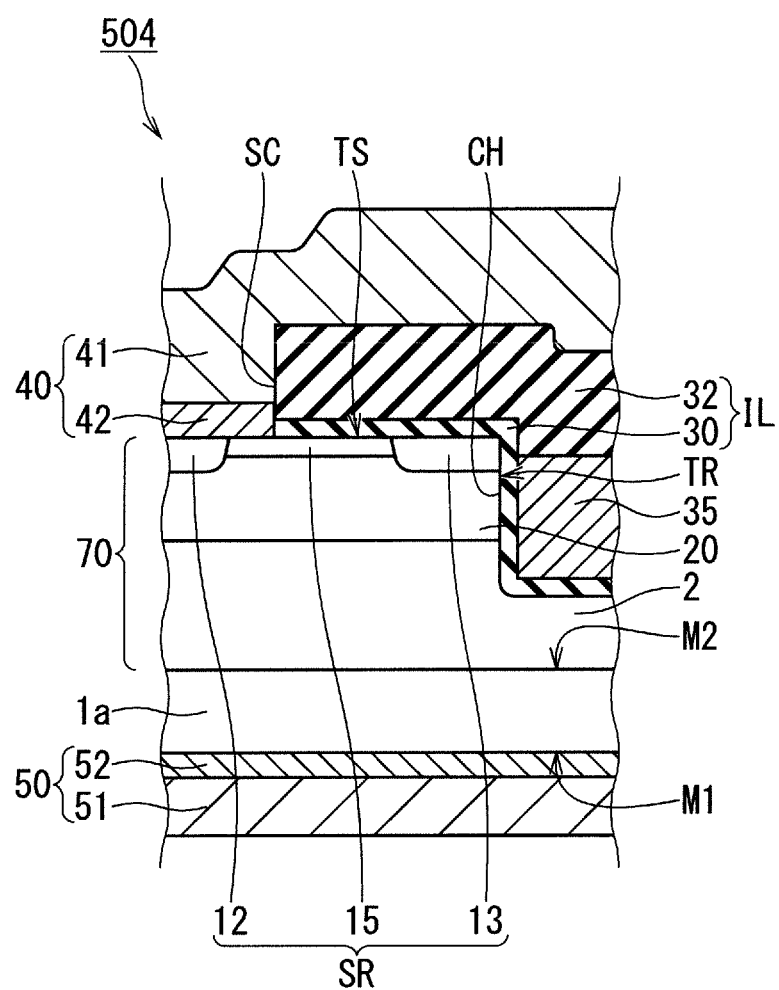
FIG. 20 is a cross-sectional view schematically showing the configuration of the semiconductor device according to the fourth embodiment of the present invention at a cross section taken along a line XX-XX in FIG. 19.
Figure 21:
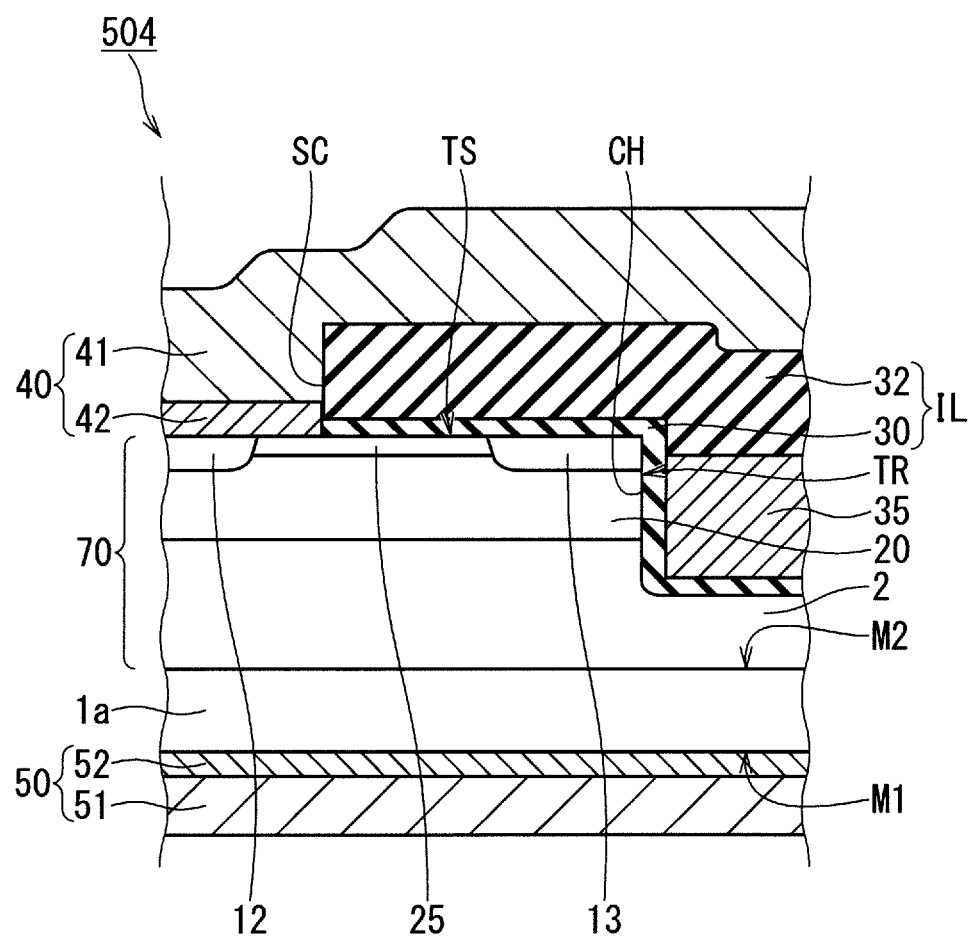
FIG. 21 is a cross-sectional view schematically showing the configuration of the semiconductor device according to the fourth embodiment of the present invention at a cross section taken along a line XXI-XXI in FIG. 19.

FIG. 19 is a top view schematically showing the configuration of a semiconductor layer (epitaxial layer 70 in FIGS. 20 and 21) in a unit cell UC of an MOSFET 504 (semiconductor device) according to a fourth embodiment. FIGS. 20 and 21 are cross-sectional views schematically showing the configuration of the MOSFET 504 at cross sections taken along a line XX-XX and a line XXI-XXI in FIG. 19 respectively.

Unlike those of the first to third embodiments, the MOSFET 504 of the fourth embodiment is of a trench type. More specifically, a trench TR is formed in the surface TS of the epitaxial layer 70. The trench TR has a side wall penetrating the well region 20 to reach the drift layer 2. The channel CH is arranged on the side wall. Structures other than this structure are substantially the same as those of the first embodiment or the second embodiment described above. Thus, corresponding or comparable structures will be given the same sign and will not be described repeatedly.

(Manufacturing Method)

A method of manufacturing the MOSFET 504 will be described below.

First, steps substantially similar to those shown in FIGS. 9 to 12 (first embodiment) are performed. Unlike in the first embodiment, in the fourth embodiment, the well region 20 and the source extension region 13 may be continuous with each other between adjacent unit cells UC. In other words, the JFET region 11 may be omitted.

Next, selective etching is performed to form the trench TR in a region between the unit cells UC. The trench TR is formed to a greater depth than the bottom of the well region 20 in such a manner as to contact the well region 20 and the source extension region 13. The source extension region 13 and the well region 20 are arranged side by side in the longitudinal direction (a direction vertical to the surface TS of the epitaxial layer 70, namely, the depth direction of the trench TR) and exposed at the side wall of the trench TR. The trench TR has a corner shape that is desirably a tapered shape or a round shape for reducing electrical field concentration occurring during the operation of the MOSFET 504. Desirably, the side wall of the trench TR is approximately vertical to the surface TS of the epitaxial layer 70.

Next, the side wall of the trench TR is cleaned by sacrificial oxidation process or chemical dry etching (CDE), for example. Then, the technique similar to that of the first embodiment is used to form the gate insulating film 30 and the gate electrode 35.

The gate insulating film 30 is formed on at least a part of the surface TS in the presence of the trench TR. As shown in FIGS. 20 and 21, the gate insulating film 30 may be formed to extend further on the surface TS beyond the trench TR. At least a part of the gate electrode 35 is buried in the trench TR to be adjacent to the source extension region 13, the well region 20, and the drift layer 2 exposed at the side wall of the trench TR across the gate insulating film 30. Namely, the gate electrode 35 extends over the source extension region 13, the well region 20, and the drift layer 2 exposed at the side wall of the trench TR. In the fourth embodiment, a part of the well region 20 placed between the source extension region 13 and the drift layer 2 under the well region 20 and adjacent to the trench TR functions as the channel CH.

In FIGS. 20 and 21, the gate electrode 35 remains only inside the trench TR (side wall part thereof) and the gate electrode 35 is buried entirely in the trench TR. Alternatively, the gate electrode 35 may be buried in the trench TR only partially. This structure can be obtained by locating a terminal portion of the gate electrode 35 in the in-plane direction outside the trench TR during patterning of the gate electrode 35.

Next, by following the same procedure as that of the first embodiment, the interlayer insulating film 32, the source electrode 40, and the drain electrode 50 are formed. As a result, the MOSFET 504 is obtained.

In FIGS. 20 and 21, the gate electrode 35 is formed in such a manner as to be adjacent to the source extension region 13 (overlap the source extension region 13 in the transverse direction) across the gate insulating film 30. This is important from the viewpoint of preventing increase in a channel resistance in the MOSFET.

According to the fourth embodiment, the trench-type MOSFET achieves effect substantially comparable to that achieved by the first or second embodiment. In particular, while control over a saturation current using JFET effect cannot be exerted for the absence of the JFET region 11 (FIGS. 2 and 3: first embodiment) in the trench type, the fourth embodiment allows control over a saturation current by means of control over a source resistance.

Figure 22:
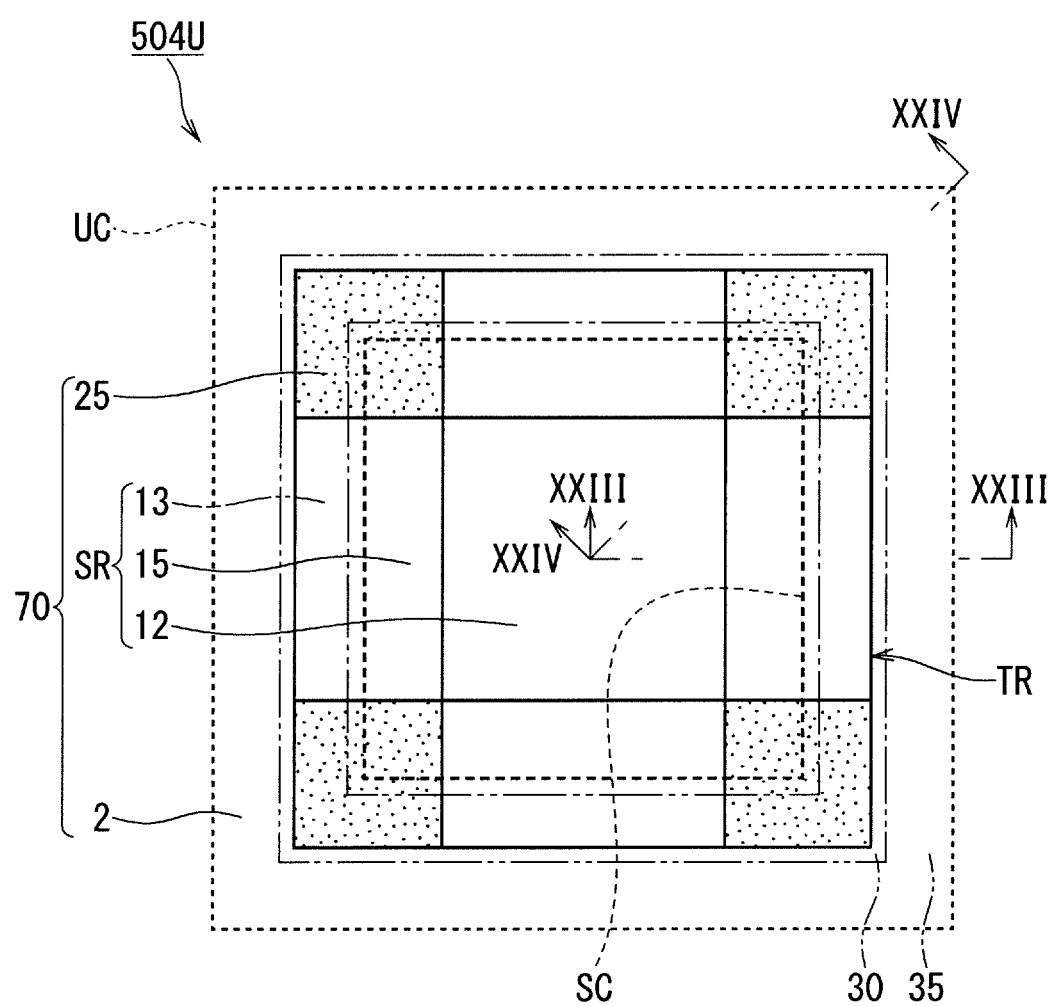
FIG. 22 is a top view schematically showing the configuration of a semiconductor layer in a unit cell of a semiconductor device according to a modification of the fourth embodiment of the present invention.
Figure 23:
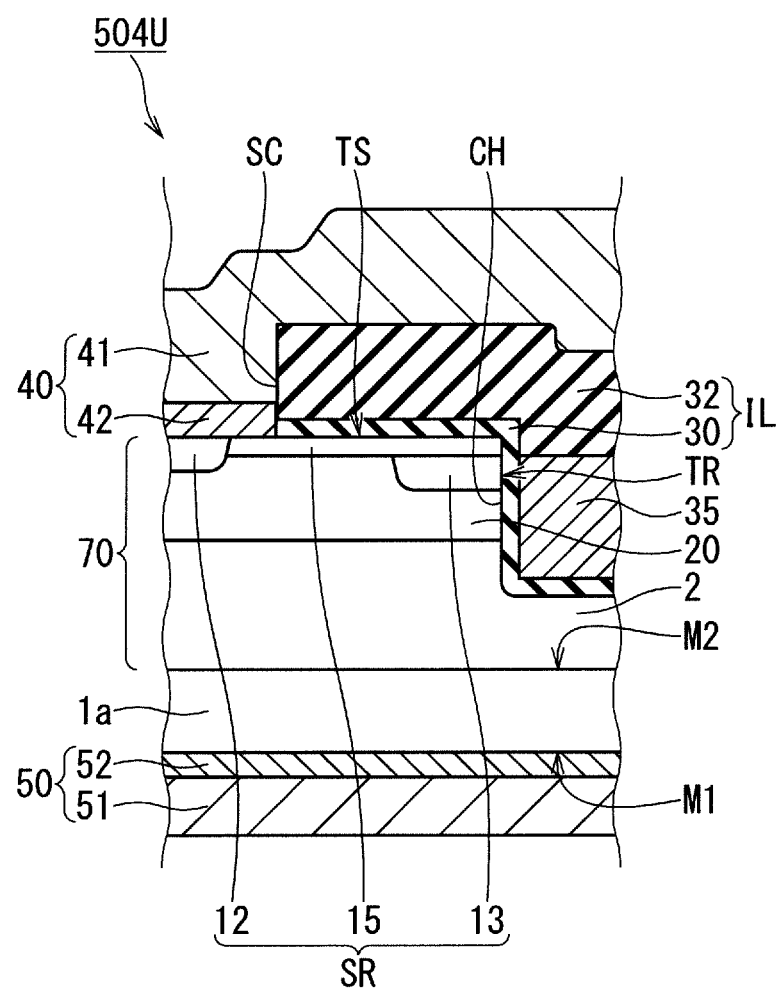
FIG. 23 is a cross-sectional view schematically showing the configuration of the semiconductor device according to the modification of the fourth embodiment of the present invention at a cross section taken along a line XXIII-XXIII in FIG. 22.

FIG. 22 is a top view schematically showing the configuration of a semiconductor layer (epitaxial layer 70 in FIGS. 23 and 24) in a unit cell UC of an MOSFET 504U (semiconductor device) according to a modification of the fourth embodiment. FIGS. 23 and 24 are cross-sectional views schematically showing the configuration of the MOSFET 504U at cross sections taken along a line XXIII-XXIII and a line XXIV-XXIV in FIG. 22 respectively.

Unlike in the MOSFET 504 described above, in the MOSFET 504U, the source extension region 13 is arranged at a greater depth than the source resistance region 15. This allows reduction in the unit cell UC of the MOSFET. In this way, while a resistance value at the source resistance region 15 is maintained, a current allowed to flow in the same area can be increased.

As shown in FIG. 24, according to this modification, the source extension region 13 is formed to extend further under the well contact region 25. In this way, the channel CH is further formed under the well contact region 25. Thus, channel density is increased. This achieves the effect of reducing an on-resistance to a greater extent. If this effect is not required, the source extension region 13 is not required to be provided under the well contact region 25.

Fifth Embodiment

Figure 25:
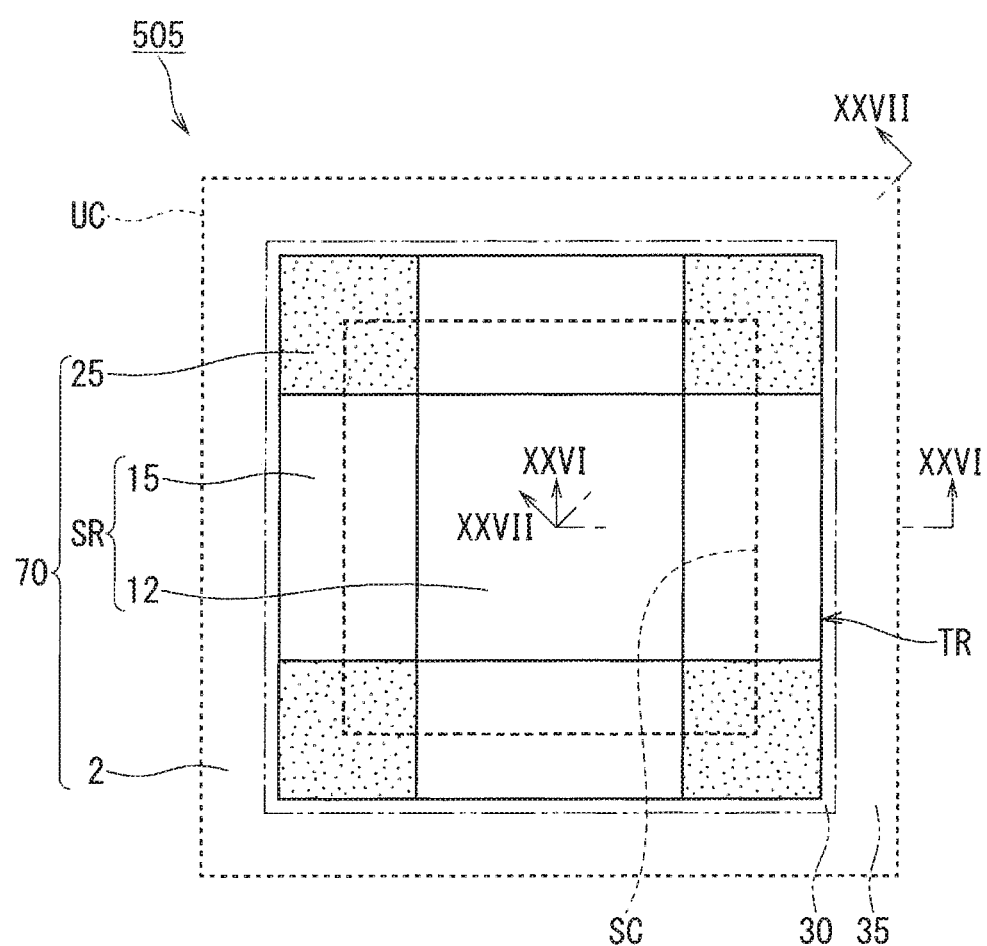
FIG. 25 is a top view schematically showing the configuration of a semiconductor layer in a unit cell of a semiconductor device according to a fifth embodiment of the present invention.
Figure 26:
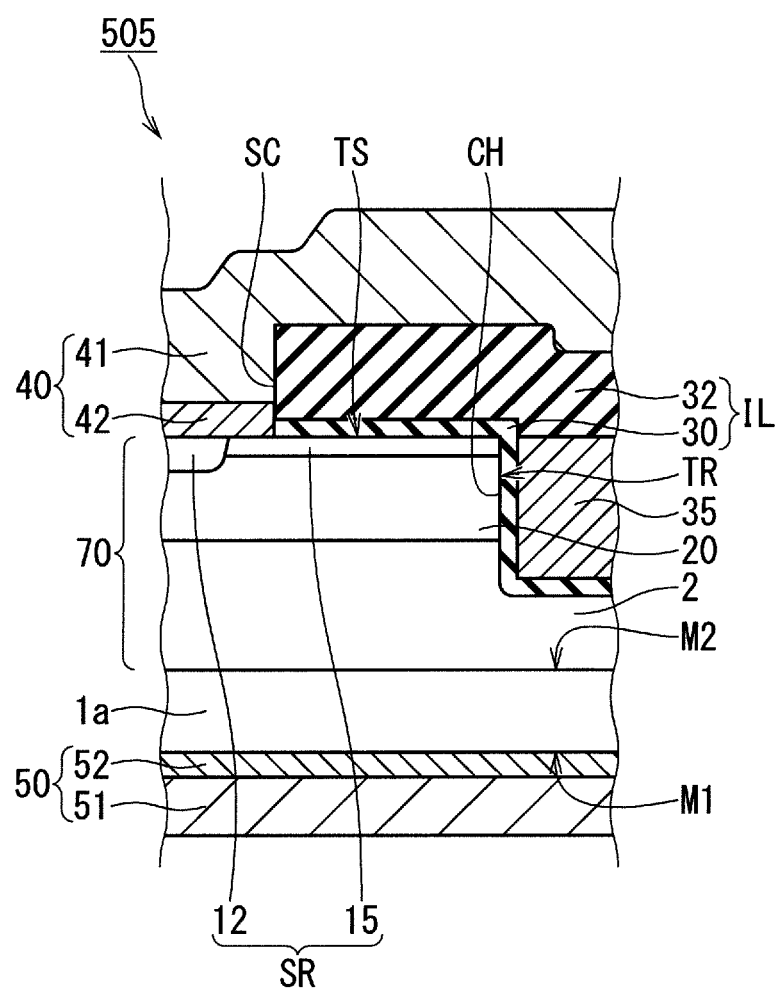
FIG. 26 is a cross-sectional view schematically showing the configuration of the semiconductor device according to the fifth embodiment of the present invention at a cross section taken along a line XXVI-XXVI in FIG. 25.

FIG. 25 is a top view schematically showing the configuration of a semiconductor layer (epitaxial layer 70 in FIGS. 26 and 27) in a unit cell UC of an MOSFET 505 (semiconductor device) according to a fifth embodiment. FIGS. 26 and 27 are cross-sectional views schematically showing the configuration of the MOSFET 505 at cross sections taken along a line XXVI-XXVI and a line XXVII-XXVII in FIG. 25 respectively.

In the MOSFET 505, the source region SR is formed of the source contact region 12 and the source resistance region 15. Namely, the source extension region 13 described in the fourth embodiment is not provided. In a plan view (FIG. 25), the source extension region 13 (FIG. 1: first embodiment) is omitted by arranging each region in such a manner that the outer periphery of the source resistance region 15 and the trench TR (channel CH) contact each other.

Structures other than the foregoing structures are substantially the same as those of the fourth embodiment described above. Thus, corresponding or comparable structures will be given the same sign and will not be described repeatedly.

According to the fifth embodiment, the pitch length of the unit cell UC can be reduced. This achieves increase in a current allowed to flow per unit area in the MOSFET.

The well contact region 25 may be arranged in such a manner as not to have a part contacting the gate electrode 35 with only the gate insulating film 30 interposed therebetween. Similar to the modification from FIG. 15 to FIG. 18, for example, this structure can be obtained in FIG. 25 by shifting the well contact region 25 toward the center of the unit cell UC in the presence of the source contact region 12. This achieves effect comparable to that achieved by the modification in FIG. 18.

Figure 28:
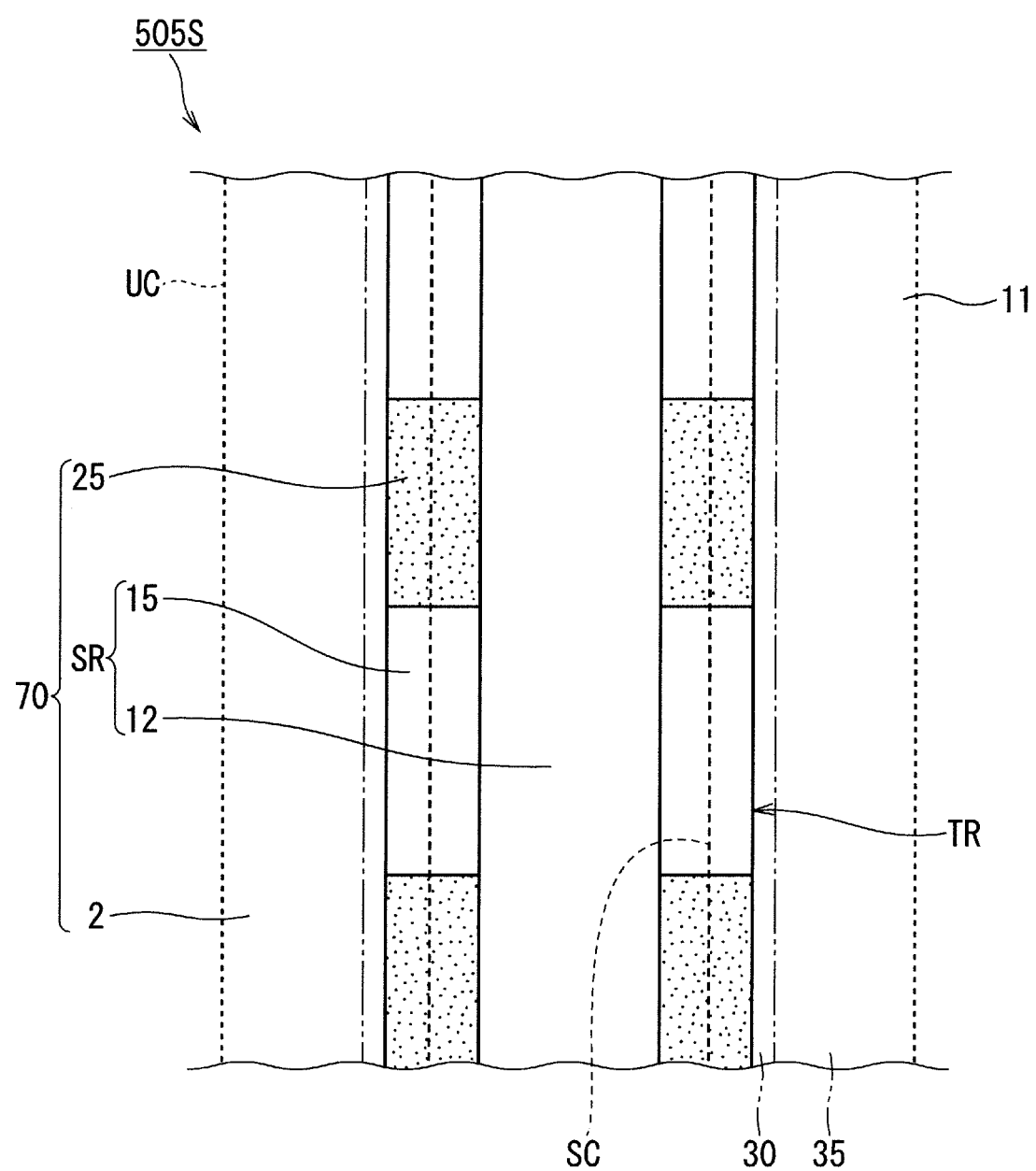
FIG. 28 is a top view showing a modification of FIG. 25.

FIG. 28 is a top view showing an MOSFET 505S (semiconductor device) as a modification of FIG. 25. The MOSFET 505S has a configuration with a plurality of unit cells UC arranged in a stripe shape (comb-like shape). One of these unit cells SC is shown in FIG. 28. Each unit cell UC extends in a direction in which the stripe shape extends (longitudinal direction in FIG. 28). The unit cells UC are aligned in a direction (transverse direction in FIG. 28) crossing this extension direction. As another modification, the well contact region 25 may be arranged in such a manner as not to have a part contacting the gate electrode 35 with only the gate insulating film 30 interposed therebetween. Similar to the modification from FIG. 15 to FIG. 18, for example, this structure can be obtained in FIG. 28 by shifting the well contact region 25 toward the center of the unit cell UC in the presence of the source contact region 12. This achieves effect comparable to that achieved by the modification in FIG. 18.

Sixth Embodiment

FIG. 29 is a cross-sectional view schematically showing the configuration of an MOSFET 506 (semiconductor device) according to a sixth embodiment taken from a viewing field similar to that of FIG. 26. The MOSFET 506 includes a trench bottom protective region 21 having the p-type provided at the bottom of the trench TR. This suppresses electric field applied to the bottom of the trench TR. In this way, a leakage current is reduced in the gate insulating film 30. This achieves increase in the reliability of the MOSFET.

The trench bottom protective region 21 is required to be connected electrically to the source electrode 40. For this purpose, the trench bottom protective region 21 is provided to have an extended part extending beyond the bottom of the trench TR, and a contact region comparable to the well contact region 25 is provided in such a manner as to be continuous with the extended part.

FIG. 30 is a cross-sectional view schematically showing the configuration of an MOSFET 506D (semiconductor device) according to a modification of the sixth embodiment taken from a viewing field similar to that of FIG. 26. The MOSFET 506D includes a trench side wall protective region 22 having the p-type. The trench side wall protective region 22 is provided on a part of the side wall of the trench TR, and contacts the trench bottom protective region 21 and the well region 20. According to this modification, the foregoing electrical connection between the trench bottom protective region 21 and the source electrode 40 is established by using the trench side wall protective region 22. The trench side wall protective region 22 is formed by ion implantation performed with the semiconductor substrate 1a in a tilted position after formation of the trench TR or ion implantation performed by applying high energy on the order of MeV, for example.

As the channel CH (FIG. 29) is required to be provided for fulfilling the function as the MOSFET, the trench side wall protective region 22 is provided only on a part of the side wall of the trench TR in a plan view. The following describes five examples of the arrangement of the trench side wall protective region 22 in a plan view.

Figure 31:
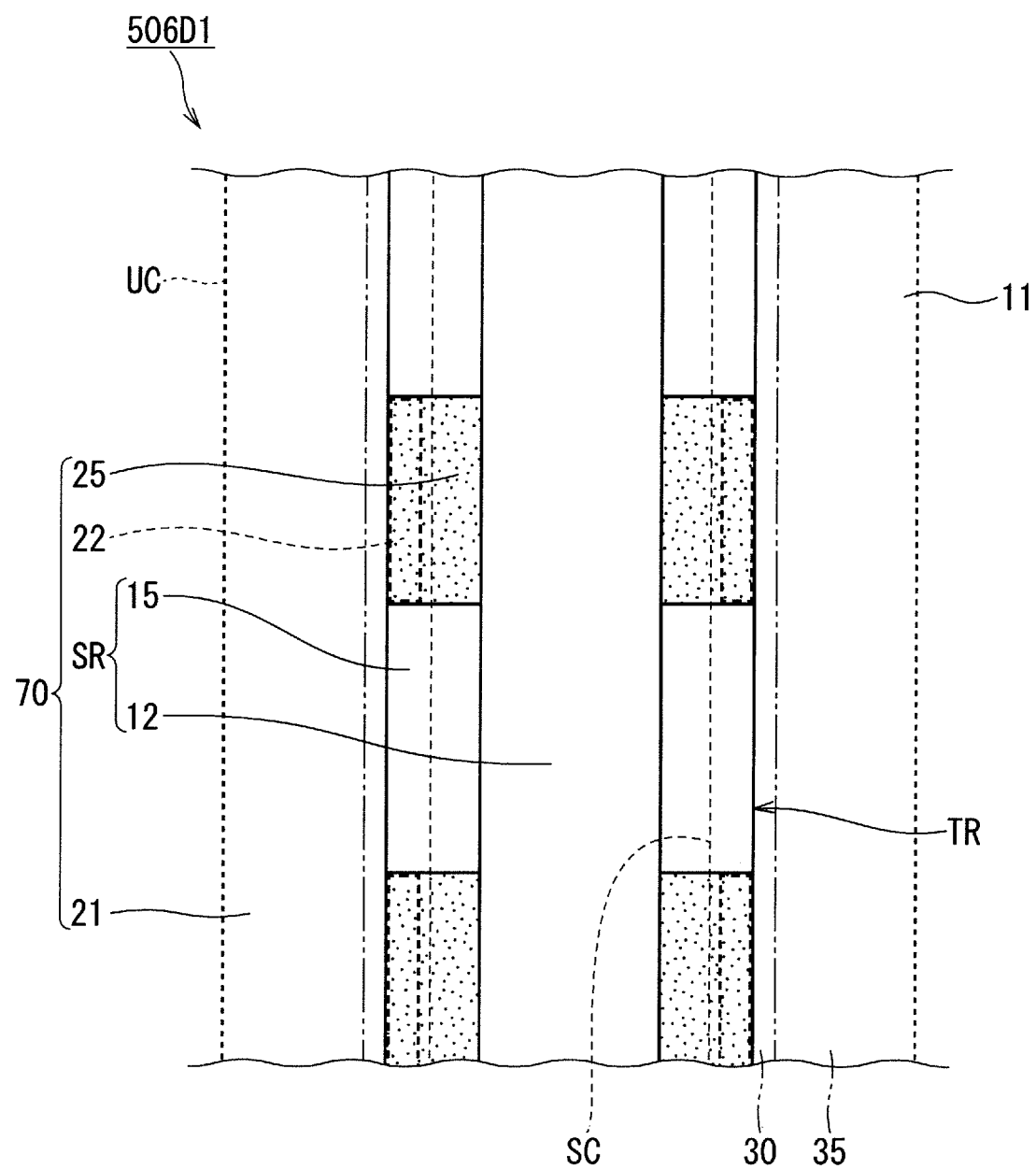
FIG. 31 is a top view schematically showing the configuration of a semiconductor layer in a unit cell of a semiconductor device according to a modification of the sixth embodiment of the present invention.

FIG. 31 is a top view showing an MOSFET 506D1 (semiconductor device) as a first example. In the first example, the trench side wall protective region 22 is arranged in such a manner that the trench side wall protective region 22 entirely overlaps the well contact region 25 in a plan view. Alternatively, the trench side wall protective region 22 may be arranged in such a manner that the trench side wall protective region 22 partially overlaps the well contact region 25. The well contact region 25 does not in the source region SR. Thus, the arrangement of the trench side wall protective region 22 in such a manner as to overlap the well contact region 25 makes it unlikely that a region to function as the channel CH will be sacrificed.

At least a part of the trench side wall protective region 22 may be arranged to be adjacent to the well contact region 25 in a plan view. In this case, the well contact region 25 as a region in the absence of the channel CH is arranged in the vicinity of the trench side wall protective region 22. This can reduce influence of current confinement occurring in the vicinity of the trench side wall protective region 22 over an on-resistance.

Figure 32:
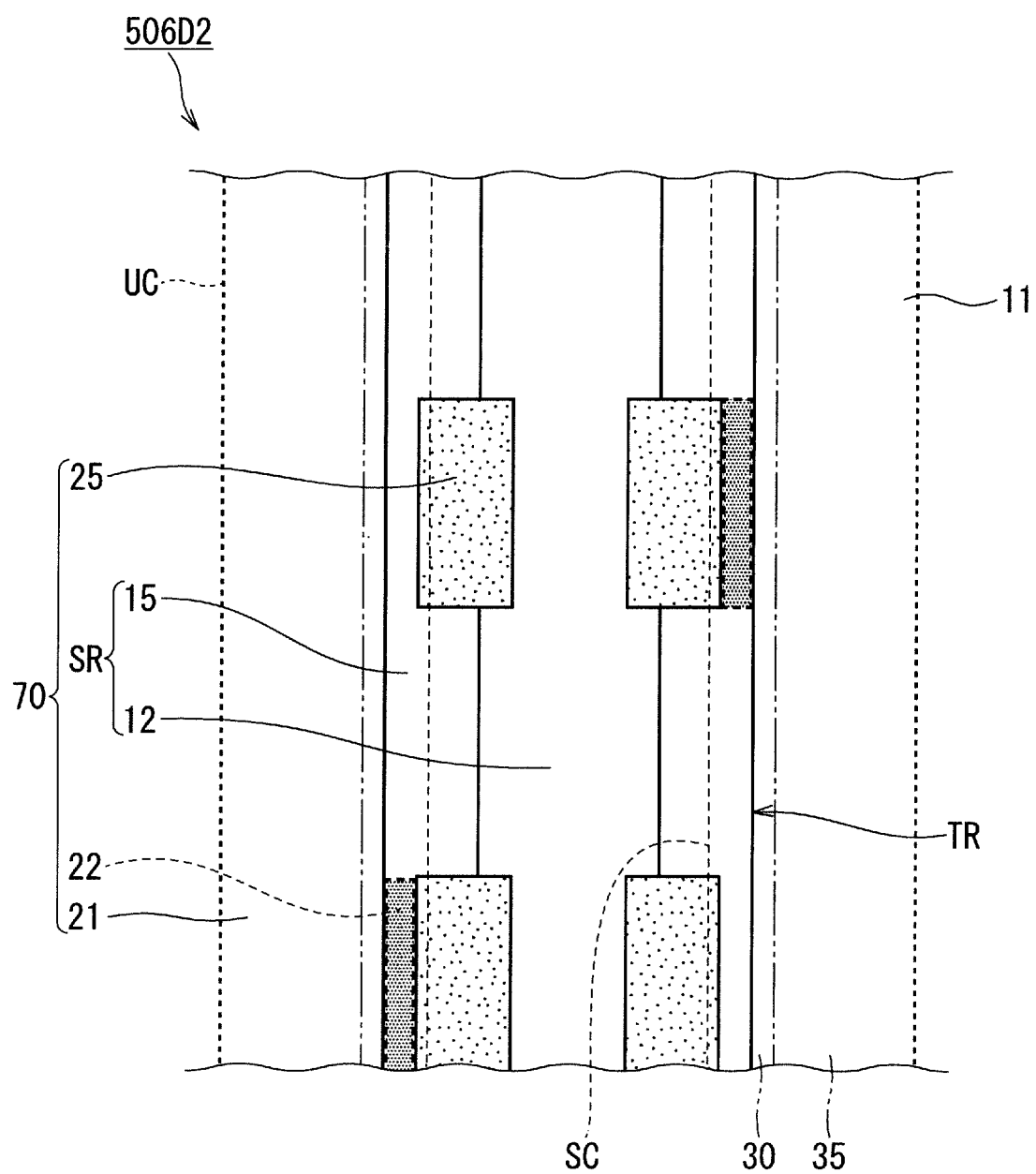
FIG. 32 is a top view schematically showing the configuration of a semiconductor layer in a unit cell of a semiconductor device according to a modification of the sixth embodiment of the present invention.

FIG. 32 is a top view showing an MOSFET 506D2 (semiconductor device) as a second example. In FIG. 32, to increase the viewability of the drawing, the trench side wall protective region 22 hidden under the source resistance region 15 is give a dense dot pattern. In the second example, the well contact region 25 is separated from the trench TR. This prevents sacrificing of a range to become the channel CH to be caused by the provision of the well contact region 25. Thus, an on-resistance can be reduced to a greater extent. Additionally, a part contacting the gate electrode 35 with only the gate insulating film 30 interposed therebetween is not formed in the well contact region 25. In this way, the reliability of the gate insulating film 30 is improved.

As shown in FIG. 32, the trench side wall protective region 22 may be arranged in a region between the well contact region 25 and the trench TR in a plan view. This makes it possible to suppress increase in an on-resistance to be caused by the provision of the trench side wall protective region 22, compared to a configuration in which the trench side wall protective region 22 is arranged in a different region. To obtain a lower on-resistance, the trench side wall protective regions 22 may be arranged not in all regions (in FIG. 32, four regions) between a plurality of parts (in FIG. 32, four parts) of the well contact region 25 and the trench TR but may be arranged only in some of these regions (in FIG. 32, two regions).

All the trench side wall protective regions 22 may be omitted from the configuration of FIG. 32. This prevents increase in an on-resistance to be caused by the provision of the trench side wall protective region 22. Additionally, as the well contact region 25 is separated from the trench TR, an on-resistance is reduced. In this way, the on-resistance can be reduced significantly.

Figure 33:
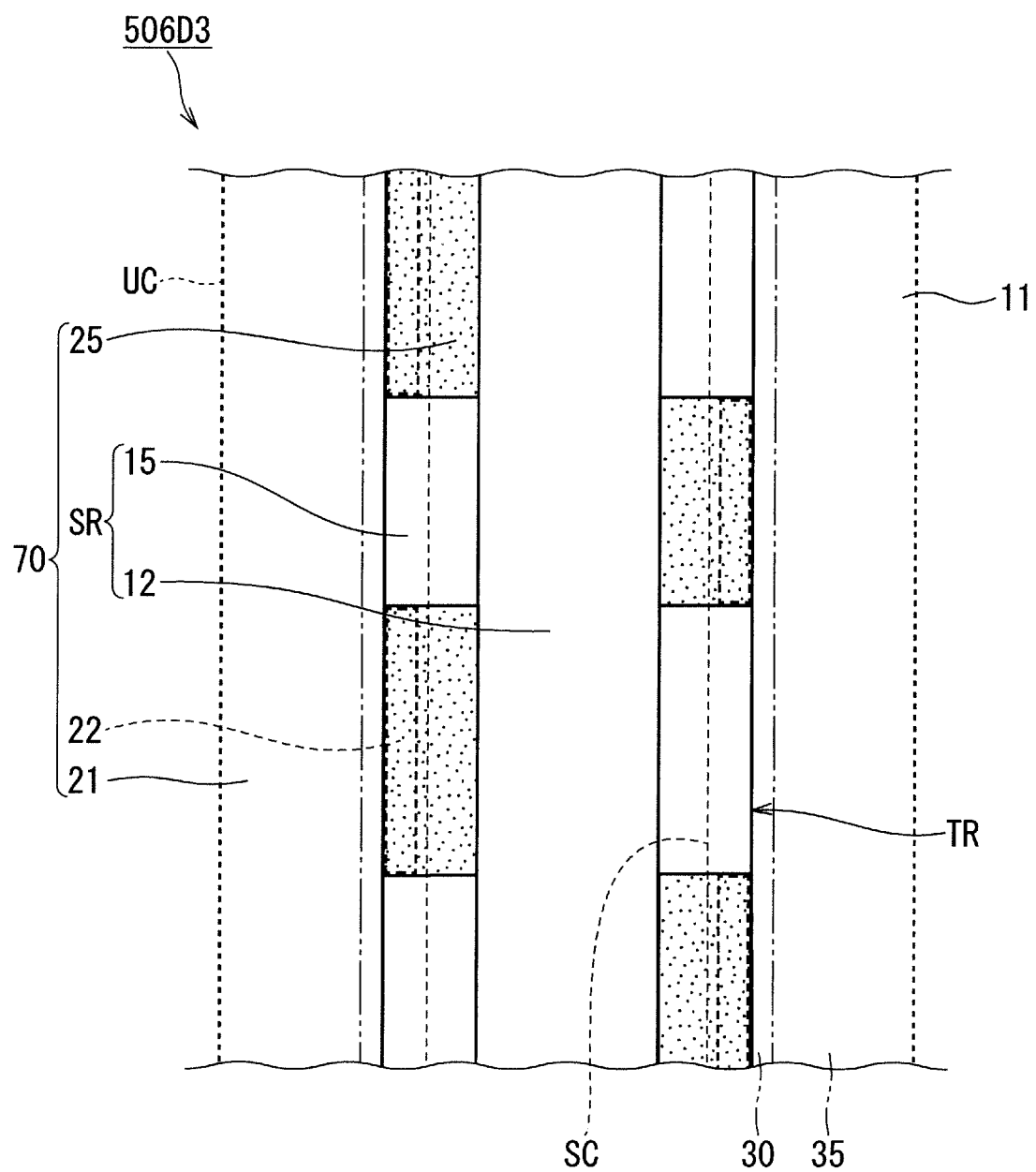
FIG. 33 is a top view schematically showing the configuration of a semiconductor layer in a unit cell of a semiconductor device according to a modification of the sixth embodiment of the present invention.

FIG. 33 is a top view showing an MOSFET 506D3 (semiconductor device) as a third example. In the MOSFET 506D3, the well contact region 25 has parts opposite to each other across the source contact region 12 in a direction crossing a direction in which a stripe shape extends, and the centers of these opposite parts are shifted from each other in the direction in which the stripe shape extends. In other words, these opposite parts face each other in an oblique direction to the extension direction of the stripe shape. As shown in FIG. 33, the well contact region 25 and the trench side wall protective region 22 may be arranged in such a manner as not to be opposite to each other in a direction orthogonal to the direction in which the stripe shape extends. This example achieves more uniform current density in the source contact region 12. Thus, a resistance value is reduced at the source contact region 12 and the reliability of the MOSFET is increased in response to flow of a large current.

Figure 34:
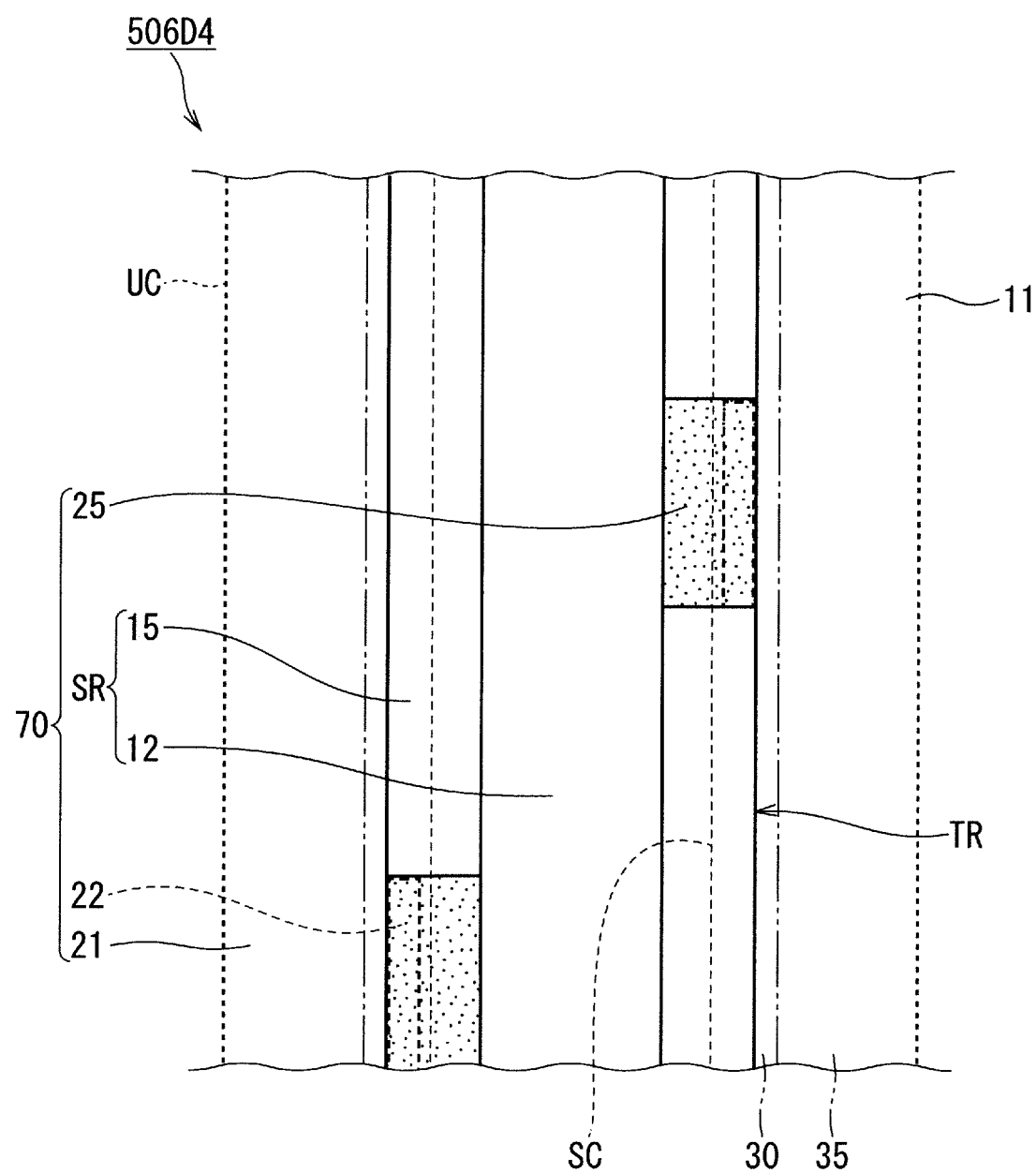
FIG. 34 is a top view schematically showing the configuration of a semiconductor layer in a unit cell of a semiconductor device according to a modification of the sixth embodiment of the present invention.

FIG. 34 is a top view showing an MOSFET 506D4 (semiconductor device) as a fourth example. In the fourth example, the well contact regions 25 are provided at a smaller number of places than in the configuration shown in FIG. 33. This provides parts of the source resistance region 15 opposite to each other across the source contact region 12 in a direction orthogonal to the direction in which a stripe shape extends. The fourth example prevents sacrificing of a range to become the channel CH to be caused by the provision of the well contact region 25. This makes it possible to suppress increase in an on-resistance.

Figure 35:
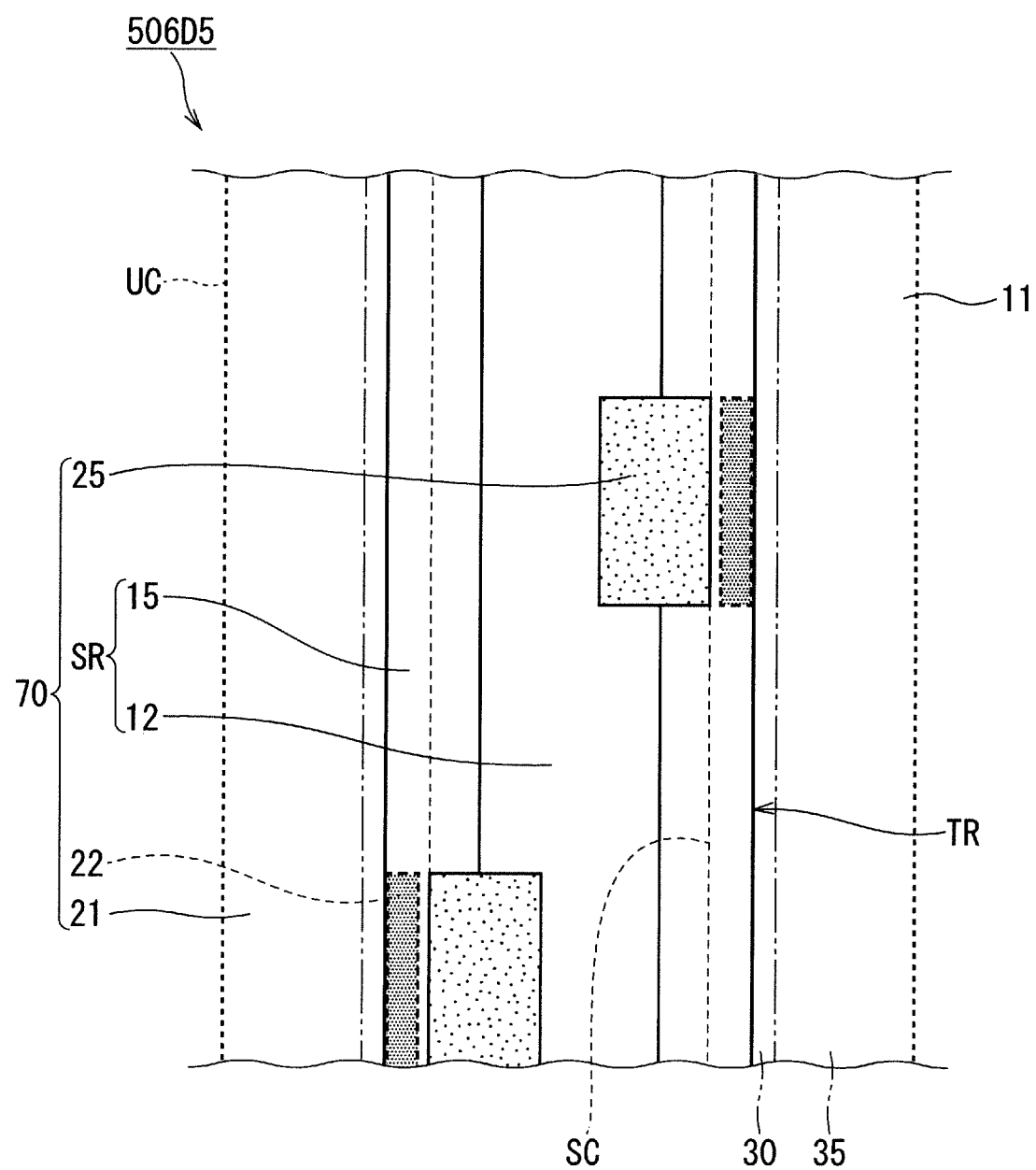
FIG. 35 is a top view schematically showing the configuration of a semiconductor layer in a unit cell of a semiconductor device according to a modification of the sixth embodiment of the present invention.

FIG. 35 is a top view showing an MOSFET 506D5 (semiconductor device) as a fifth example. In the fifth example, the well contact region 25 of the MOSFET 506D4 (FIG. 34) is separated from the trench TR. This prevents sacrificing of a range to become the channel CH to be caused by the provision of the well contact region 25. This makes it possible to reduce an on-resistance to a greater extent. Additionally, a part contacting the gate electrode 35 with only the gate insulating film 30 interposed therebetween is not formed in the well contact region 25. In this way, the reliability of the gate insulating film 30 is improved.

Even if the semiconductor devices described above shown in the first to sixth embodiments are formed by different manufacturing methods, the effects achieved by the configurations of these semiconductor devices are also attainable as long as these configurations are maintained. The present invention is feasible by combining all the embodiments freely, or if appropriate, by modifying or omitting each embodiment within the scope of the invention. While the invention has been shown and described in detail, the foregoing description is in all aspects illustrative and not restrictive. It is therefore understood that numerous modifications not shown can be devised without departing from the scope of the invention.

EXPLANATION OF REFERENCE SIGNS

M1 Lower surface (first main surface)
M2 Upper surface (second main surface)
CH Channel
IL Insulating layer
SC Contact hole
UC Unit cell
SR Source region
TR Trench
TS Surface
1a, 1b Semiconductor substrate
2 Drift layer
11 JFET region
12 Source contact region
13 Source extension region
15 Source resistance region
15H High-concentration part (first part)
15L Low-concentration part (second part)
15R Separation layer
15a to 15d Source resistance part
15e Overlapping part
15m Effective part
20 Well region
20W Semiconductor layer
21 Trench bottom protective region
22 Trench side wall protective region
25 Well contact region
25a to 25d Well contact part
30 Gate insulating film
32 Interlayer insulating film
35 Gate electrode
40 Source electrode
41, 51 Electrode layer
42 Source contact electrode
50 Drain electrode
52 Drain contact electrode
70 Epitaxial layer (semiconductor layer)
100a to 100d Implantation mask
501, 501R, 501S1, 501S2, 501W, 502, 503, 503D, 504, 504U, 505, 505S, 506, 506D, 506D1 to 506D5 MOSFET (semiconductor device)
501T IGBT (semiconductor device)

The invention claimed is:

1. A semiconductor device having a channel, the semiconductor device comprising:
a semiconductor substrate having a first main surface and a second main surface on the opposite side of the first main surface, and having an in-plane direction parallel to the second main surface;
a drain electrode provided on the first main surface of the semiconductor substrate;
a drift layer provided on the second main surface of the semiconductor substrate and having a first conductivity type;
a well region provided on the drift layer, having a second conductivity type different from the first conductivity type, and having a part forming the channel of the semiconductor device;
a well contact region provided on the well region, having the second conductivity type, and having a resistivity lower than that of the well region;
a source contact region provided on the well region, separated from the drift layer by the well region, and having the first conductivity type;
a source resistance region provided on the well region, separated from the drift layer by the well region, adjacent to the source contact region in the in-plane direction, having the first conductivity type, and having a sheet resistance higher than that of the source contact region;
a gate insulating film covering the channel of the well region;
a gate electrode provided on the gate insulating film; and
a source electrode contacting the source contact region and the well contact region, and continuous with the channel at least through the source resistance region, the source electrode directly contacting the source resistance region.

2. The semiconductor device according to claim 1, wherein
the semiconductor device comprises an insulating layer including the gate insulating film,
the insulating layer is provided with a contact hole in which the source electrode is buried, and
the contact hole has an outer periphery crossing the source resistance region.

3. The semiconductor device according to claim 1, wherein
the channel extends in the in-plane direction.

4. The semiconductor device according to claim 1, wherein
a trench having a side wall penetrating the well region to reach the drift layer is provided, and
the channel is arranged on the side wall.

5. The semiconductor device according to claim 4, further comprising:
a trench bottom protective region provided at the bottom of the trench and having the second conductivity type; and
a trench side wall protective region provided on a part of the side wall of the trench, contacting the trench bottom protective region and the well region, and having the second conductivity type.

6. The semiconductor device according to claim 5, wherein
at least a part of the trench side wall protective region is arranged to be adjacent to or overlap the well contact region in a plan view.

7. The semiconductor device according to claim 1, further comprising:
a source extension region adjacent to the source resistance region, separated from the source contact region, separated from the drift layer by the well region, and having the first conductivity type, wherein
the source resistance region is continuous with the channel through the source extension region.

8. The semiconductor device according to claim 7, wherein
each of the source resistance region and the well contact region is arranged between the source contact region and the source extension region in the in-plane direction.

9. The semiconductor device according to claim 1, wherein
the source resistance region is adjacent to the well contact region in the in-plane direction.

10. The semiconductor device according to claim 1, wherein
the source resistance region includes a first part arranged on the well region and a second part arranged on the first part, and
the first part has a resistivity lower than that of the second part.

11. The semiconductor device according to claim 1, wherein
the well contact region is arranged in such a manner as not to have a part contacting the gate electrode with only the gate insulating film interposed therebetween.

12. The semiconductor device according to claim 1, wherein
a contact resistance between the source electrode and the source resistance region is ten times larger or more than a contact resistance between the source electrode and the source contact region.

13. The semiconductor device according to claim 1, wherein
the semiconductor device has a plurality of unit cells arranged in a stripe shape,
the well contact region has parts opposite to each other across the source contact region in a direction crossing a direction in which the stripe shape extends, and
the centers of the opposite parts are shifted from each other in the direction in which the stripe shape extends.

14. The semiconductor device according to claim 1, wherein
the semiconductor substrate, the drift layer, and the well region are made of silicon carbide.

15. The semiconductor device according to claim 1, wherein the source resistance region is adjacent to the well contact region in the in-plane direction.

* * * * *